United States Patent
Wu et al.

(10) Patent No.: US 11,750,132 B2
(45) Date of Patent: *Sep. 5, 2023

(54) SYSTEM AND METHOD FOR DAMPING OF MECHANICAL OSCILLATON OF A ROTOR OF AN ELECTRIC MACHINE IN A VEHICLE

(71) Applicant: Deere & Company, Moline, IL (US)

(72) Inventors: Yujiang Wu, Fargo, ND (US); Christopher J. Tremel, West Fargo, ND (US); Kent D. Wanner, Fargo, ND (US)

(73) Assignee: Deere & Company, Moline, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/643,710

(22) Filed: Dec. 10, 2021

(65) Prior Publication Data

US 2023/0029626 A1 Feb. 2, 2023

Related U.S. Application Data

(60) Provisional application No. 63/203,775, filed on Jul. 30, 2021.

(51) Int. Cl.
*H02P 27/04* (2016.01)
*H02P 23/04* (2006.01)
(Continued)

(52) U.S. Cl.
CPC .............. *H02P 23/04* (2013.01); *B60L 53/20* (2019.02); *H03H 17/02* (2013.01); *H03H 2017/009* (2013.01); *H03H 2017/0081* (2013.01)

(58) Field of Classification Search
CPC .......... H02P 23/04; H02P 21/05; H02P 21/20; H02P 27/06; H02P 6/10; H02P 2205/05;
(Continued)

(56) References Cited

U.S. PATENT DOCUMENTS

| 2007/0279012 A1 | 12/2007 | Sihler |
| 2013/0296128 A1 | 11/2013 | Nefcy et al. |
| 2014/0306638 A1 | 10/2014 | Wu et al. |

FOREIGN PATENT DOCUMENTS

| EP | 2194290 A2 | 6/2010 | |
| JP | 2006036197 A | * 2/2006 | ............ B60K 6/445 |
| JP | 2008167612 A | * 7/2008 | |

OTHER PUBLICATIONS

Extended European Search Report and Written Opinion issued in European Patent Application No. 22171778.8, dated Oct. 26, 2022, in 09 pages.

(Continued)

*Primary Examiner* — Karen Masih

(57) ABSTRACT

An inverter system for mitigating oscillation of an electric motor that drives a load comprises a torque command generation module for receiving a commanded torque from an operator of a vehicle. A torque damping module is configured to receive the commanded torque and generating a commanded compensating torque to dampen any mechanical oscillation or resonance of the electric motor based on the observed rotational speed of the motor. The torque damping module further comprises a digital filter of order greater than one, a gain adjuster and a limiter.

20 Claims, 11 Drawing Sheets

(51) Int. Cl.
*B60L 53/20* (2019.01)
*H03H 17/02* (2006.01)
*H03H 17/00* (2006.01)

(58) Field of Classification Search
CPC ........ H02P 29/50; H02P 25/098; B60L 53/20; H03H 17/02; H03H 2017/0081; H03H 2017/009
See application file for complete search history.

(56) References Cited

OTHER PUBLICATIONS

Extended European Search Report and Written Opinion issued in European Patent Application No. 22169288.2, dated Oct. 26, 2022, in 10 pages.

\* cited by examiner

Second Order Hybrid FIR/IIR Filter (480)

US 11,750,132 B2

SYSTEM AND METHOD FOR DAMPING OF MECHANICAL OSCILLATON OF A ROTOR OF AN ELECTRIC MACHINE IN A VEHICLE

RELATED APPLICATION

This document (including the drawings) claims priority and the benefit of the filing date based on U.S. provisional application No. 63/203,775, filed Jul. 30, 2021, and entitled SYSTEM AND METHOD FOR DAMPING OF MECHANICAL OSCILLATION OF A ROTOR OF AN ELECTRIC MACHINE IN A VEHICLE under 35 U.S.C. § 119 (e), where the provisional application is hereby incorporated by reference herein.

FIELD

This disclosure relates to a system and method for mitigating or damping mechanical oscillation of a rotor an electric machine (e.g., traction drive electric motor) in a vehicle.

BACKGROUND

In some prior art, an inverter or motor controller controls an electric motor based on a commanded torque. For a given commanded torque, the electric motor can interact with a rotational mechanical load, such as a drive train that is coupled to the electric motor, where if the rotor operates within a certain rotational speed range, undesired mechanical oscillation or undesired resonance may be present. To dampen or reduce the undesired mechanical oscillation or resonance, the inverter or motor controller may adjust the commanded torque or the corresponding commanded direct-axis current and the corresponding commanded quadrature-axis current applied to the stator windings of the alternating current electric motor. In certain prior art, analog inductive and analog capacitive filters can be coupled, selectively or switchably, to the output of the inverter to reduce such mechanical oscillation or resonance, but analog and capacitive filter may vary in tolerance (e.g. as manufactured, over time, or from thermal stress). Moreover, analog filters may require special technical resources to tune or may not be field tunable at all, depending upon the design. In other prior art, digital filters may be used in the driver module, which drive the semiconductor switches of the inverter. Such digital filters are theoretically capable of reprogramming and tuning to adjust to different vehicles, environments and industrial applications, which raises the issue of how such tuning and adjustments are practically, efficiently and technically made. Therefore, there is need for a system and method for mitigating or damping mechanical oscillation of a rotor an electric machine (e.g., traction drive electric motor) in a vehicle.

SUMMARY

In accordance with one embodiment, an inverter system for mitigating mechanical oscillation of an electric motor (or associated electromechanical system) that drives a load comprises a torque command generation module for receiving a commanded torque from an operator of a vehicle. A torque damping module is configured to receive the commanded torque and generating a commanded compensating torque to dampen any mechanical oscillation or resonance of the electric motor based on the observed rotational speed of the motor. The torque damping module further comprises a digital filter of order greater than one, a gain adjuster and a limiter.

In one aspect of the disclosure the filter has a bandpass or high-pass filter response of magnitude versus frequency, wherein the input to the filter comprises the observed rotational speed of the motor and wherein the output of the filter comprises an isolated oscillation or ripple of the observed rotational speed with a removed or attenuated DC offset in the compensating torque.

Further, a gain adjuster is coupled to the output of the filter, where the gain adjuster is configured to determine a gain of the commanded compensating torque based on the isolated oscillation or ripple of the observed rotational speed. A limiter is configured to restrict the gain to a lower limit of the gain and an upper limit of the gain based on integration of the ripple of the observed rotational speed or proportional integral control of the ripple of the observed speed.

BRIEF DESCRIPTION OF THE DRAWINGS

Like reference numbers in any set of two or more drawings indicate like features.

DETAILED DESCRIPTION

Figure 1:
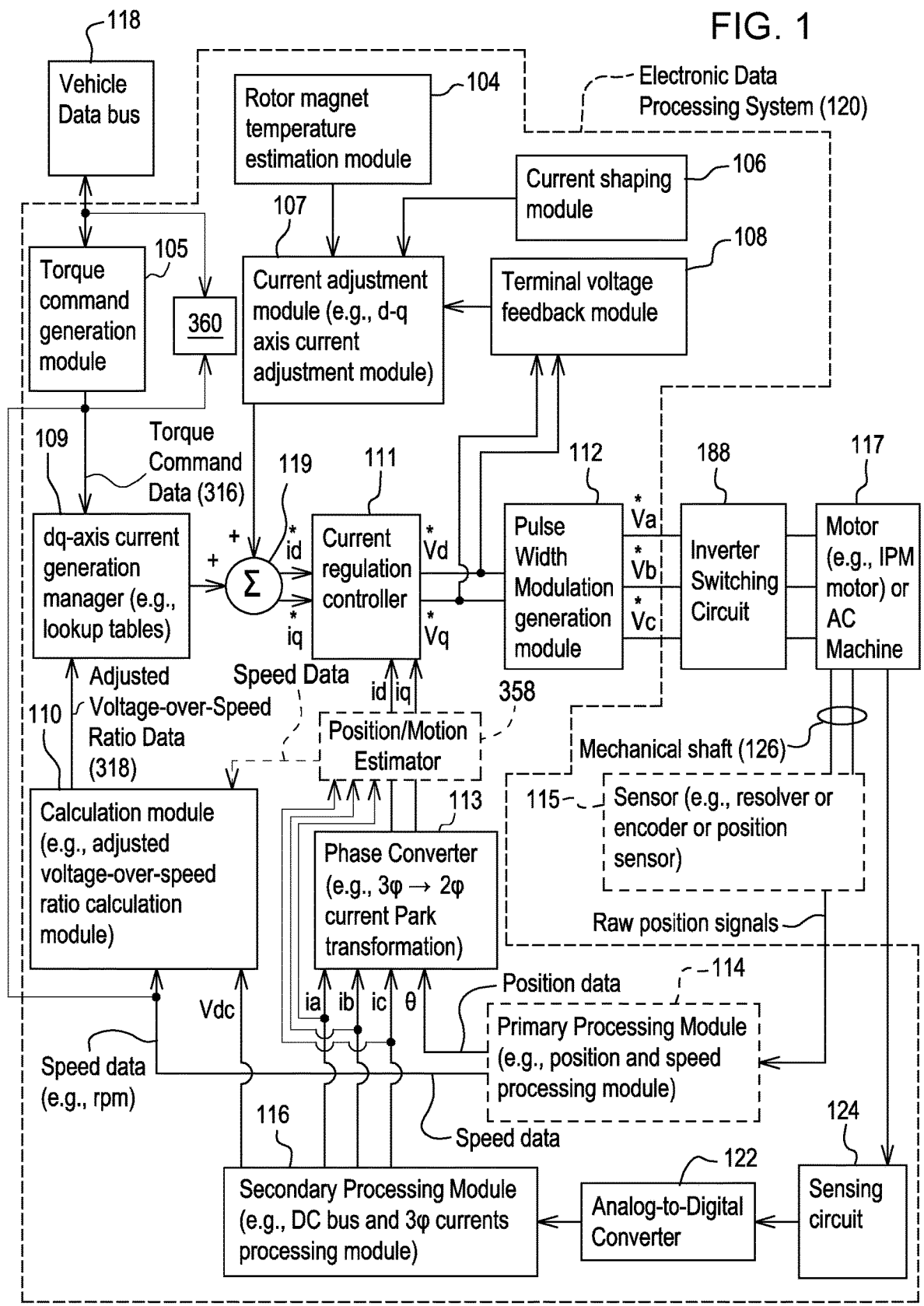
FIG. 1 is a block diagram of one embodiment of a system for controlling an alternating current electric machine that mitigates or dampens mechanical oscillation of the rotor the electric machine (e.g., traction drive electric motor) in a vehicle.

In accordance with one embodiment, FIG. 1 discloses system for controlling a motor 117 (e.g., an interior permanent magnet (IPM) motor) or another alternating current machine. In one embodiment, the system, aside from the motor 117, may be referred to as an inverter or a motor controller.

The system comprises electronic modules, software modules, or both. In one embodiment, the motor controller comprises an electronic data processing system 120 to support storing, processing or execution of software instructions of one or more software modules. The electronic data processing system 120 is indicated by the dashed lines in FIG. 1 and is shown in greater detail in FIG. 2.

The data processing system 120 is coupled to an inverter circuit 188. The inverter circuit 188 comprises a semiconductor drive circuit that drives or controls switching semiconductors (e.g., insulated gate bipolar transistors (IGBT) or other power transistors) to output control signals for the motor 117. In turn, the inverter circuit 188 is coupled to the motor 117. The motor 117 is associated with a sensor 115 (e.g., a position sensor, a resolver or encoder position sensor) that is associated with the motor shaft 126 or the rotor. The sensor 115 and the motor 117 are coupled to the data processing system 120 to provide feedback data (e.g., current feedback data, such as ia, ib, ic), raw position signals, among other possible feedback data or signals, for example. Other possible feedback data includes, but is not limited to, winding temperature readings, semiconductor temperature readings of the inverter circuit 188, three phase voltage data, or other thermal or performance information for the motor 117.

In one embodiment, the torque command generation module 105 is coupled to a d-q axis current generation manager 109 (e.g., d-q axis current generation look-up tables). D-q axis current refers to the direct axis current and the quadrature axis current as applicable in the context of vector-controlled alternating current machines, such as the motor 117. The output of the d-q axis current generation manager 109 and the output of a current adjustment module 107 (e.g., d-q axis current adjustment module 107) are fed to a summer 119. In turn, one or more outputs (e.g., direct axis current data (id*) and quadrature axis current data (iq*)) of the summer 119 are provided or coupled to a current regulation controller 111.

The current regulation controller 111 is capable of communicating with the pulse-width modulation (PWM) generation module 112 (e.g., space vector PWM generation module). The current regulation controller 111 receives respective d-q axis current commands (e.g., id* and iq*) and actual d-q axis currents (e.g., id and iq) and outputs corresponding d-q axis voltage commands (e.g., vd* and vq* commands) for input to the PWM generation module 112.

In one embodiment, the PWM generation module 112 converts the direct axis voltage and quadrature axis voltage data from two phase data representations into three phase representations (e.g., three phase voltage representations, such as va*, vb* and vc*) for control of the motor 117, for example. Outputs of the PWM generation module 112 are coupled to the inverter 188.

The inverter circuit 188 comprises power electronics, such as switching semiconductors to generate, modify and control pulse-width modulated signals or other alternating current signals (e.g., pulse, square wave, sinusoidal, or other waveforms) applied to the motor 117. The PWM generation module 112 provides inputs to a driver stage within the inverter circuit 188. An output stage of the inverter circuit 188 provides a pulse-width modulated signal or other alternating current signal for control of the motor. In one embodiment, the inverter 188 is powered by a direct current (DC) voltage bus.

The motor 117 is associated with a sensor 115 (e.g., a resolver, encoder, speed sensor, or another position sensor or sensors) that estimates at least one of an angular position of the motor shaft 126, a speed or velocity of the motor shaft 126, and a direction of rotation of the motor shaft 126. The sensor 115 may be mounted on or integral with the motor shaft 126. The output of the sensor 115 is capable of communication with the primary processing module 114 (e.g., position and speed processing module). In one embodiment, the sensor 115 may be coupled to an analog-to-digital converter (not shown) that converts analog position data or velocity data to digital position or velocity data, respectively. In other embodiments, the sensor 115 (e.g., digital position encoder) may provide a digital data output of position data or velocity data for the motor shaft 126 or rotor.

A first output (e.g., position data and speed data for the motor 117) of the primary processing module 114 is communicated to the phase converter 113 (e.g., three-phase to two-phase current Park transformation module) that converts respective three-phase digital representations of measured current into corresponding two-phase digital representations of measured current. A second output (e.g., speed data) of the primary processing module 114 is communicated to the calculation module 110 (e.g., adjusted voltage over speed ratio module).

An input of a sensing circuit 124 is coupled to terminals of the motor 117 for sensing at least the measured three-phase currents and a voltage level of the direct current (DC) bus (e.g., high voltage DC bus which may provide DC power to the inverter circuit 188). An output of the sensing circuit 124 is coupled to an analog-to-digital converter 122 for digitizing the output of the sensing circuit 124. In turn, the digital output of the analog-to-digital converter 122 is coupled to the secondary processing module 116 (e.g., Direct current (DC) bus and three phase current processing module). For example, the sensing circuit 124 is associated with the motor 117 for measuring three phase currents (e.g., current applied to the windings of the motor 117, back EMF induced into the windings, or both).

Certain outputs of primary processing module 114 and the secondary processing module 116 feed the phase converter 113. For example, the phase converter 113 may apply a Park transformation or other conversion equations (e.g., certain conversion equations that are suitable are known to those of ordinary skill in the art) to convert the measured three-phase representations of current into two-phase representations of current based on the digital three-phase current data from the secondary processing module 116 and position data from the sensor 115. The output of the phase converter 113 module is coupled to the current regulation controller 111.

Other outputs of the primary processing module 114 and the secondary processing module 116 may be coupled to inputs of the calculation module 110 (e.g., adjusted voltage over-speed ratio calculation module). For example, the primary processing module 114 may provide speed data (e.g., motor shaft 126 revolutions per minute), whereas the secondary processing module 116 may provide a measured level of direct current voltage (e.g., on the direct current (DC) bus of a vehicle). The direct current voltage level on the DC bus that supplies the inverter circuit 188 with electrical energy may fluctuate or vary because of various factors, including, but not limited to, ambient temperature, battery condition, battery charge state, battery resistance or reactance, fuel cell state (if applicable), motor load conditions, respective motor torque and corresponding operational speed, and vehicle electrical loads (e.g., electrically driven air-conditioning compressor). The calculation module 110 is connected as an intermediary between the secondary processing module 116 and the dq-axis current generation manager 109. The output of the calculation module 110 can adjust or impact current commands generated by the d-q axis current generation manager 109 to compensate for fluctuation or variation in direct current bus voltage, among other things.

The rotor magnet temperature estimation module 104, the current shaping module 106, and the terminal voltage feedback module 108 are coupled to or are capable of communicating with the dq-axis current adjustment module 107. In turn, the d-q axis current module 107 may communicate with the dq-axis current generation manager or the summer 119.

The rotor magnet temperature module 104 estimates or determines the temperature of the rotor permanent magnet or magnets. In one embodiment, the rotor magnet temperature estimation module 104 may estimate the temperature of the rotor magnets from internal control variables calculation, one or more sensors located on the stator, in thermal communication with the stator, or secured to the housing of the motor 117.

In one alternate embodiment, the rotor magnet temperature estimation module 104 may be replaced by or may estimate the temperature of the rotor magnets from one or more sensors located on the stator, in thermal communication with the stator, or secured to the housing of the motor 117.

In another alternative embodiment, the rotor magnet temperature estimation module 104 may be replaced with a temperature detector (e.g., a thermistor or infrared thermal detector coupled to a wireless transmitter) mounted on the rotor or the magnet, where the detector provides a signal (e.g., wireless signal) indicative of the temperature of the magnet or magnets.

In one embodiment, the method or system may operate in the following manner. The torque command generation module 105 receives an input control data message, such as a speed control data message, a voltage control data message, or a torque control data message, over a vehicle data bus 118. The torque command generation module 105 converts the received input control message into torque control command data 316.

The d-q axis current generation manager 109 selects or determines the direct axis current command data and the quadrature axis current command data associated with respective torque control command data and respective detected motor shaft 126 speed data. For example, the d-q axis current generation manager 109 selects or determines the direct axis current command, the quadrature axis current command by accessing one or more of the following: (1) a look-up table, database or other data structure that relates respective torque commands to corresponding direct and quadrature axes currents, (2) a set of quadratic equations or linear equations that relate respective torque commands to corresponding direct and quadrature axes currents, or (3) a set of rules (e.g., if-then rules) that relates respective torque commands to corresponding direct and quadrature axes currents.

In one embodiment, the optional sensor 115 on the motor 117 facilitates provision of the detected speed data for the motor shaft 126, where the primary processing module 114 may convert position data provided by the optional sensor 115 into speed data.

In an alternate embodiment, the estimator (358 or 458), which can also be referred to as position/motion estimator, can provide one or more of the following: rotor position data, rotor velocity data, and/or rotor acceleration data to the calculation module 110 or to other modules, such as the d-q axis current generation manager 109.

The current adjustment module 107 (e.g., d-q axis current adjustment module) provides current adjustment data to adjust the direct axis current command data and the quadrature axis current command data based on input data from the rotor magnet temperature estimation module 104 and the current shaping module 106.

The current shaping module 106 may determine a correction or preliminary adjustment of the quadrature axis (q-axis) current command and the direct axis (d-axis) current command based on one or more of the following factors: torque load on the motor 117 and speed of the motor 117, for example. The rotor magnet temperature estimation module 104 may generate a secondary adjustment of the q-axis current command and the d-axis current command based on an estimated change in rotor temperature, for example. The terminal voltage feedback module 108 may provide a third adjustment to d-axis and q-axis current based on controller voltage command versus voltage limit. The current adjustment module 107 may provide an aggregate current adjustment that considers one or more of the following adjustments: a preliminary adjustment, a secondary adjustment, and a third adjustment.

In one embodiment, the optional sensor 115 (e.g., shaft or rotor speed detector) may comprise one or more of the following: a direct current motor, an optical encoder, a magnetic field sensor (e.g., Hall Effect sensor), magneto-resistive sensor, and a resolver (e.g., a brushless resolver). The optional sensor 115 and optional primary processing module 114 are shown in dashed lines to indicate that they are optional and may be deleted in alternate embodiments. Further, the system may operate in a sensorless mode even if the optional sensor 115, or the primary processing module 114, or both are present, idle, disabled or in an inactive state.

In one configuration, the optional sensor 115 comprises a position sensor, where position data and associated time data are processed to determine speed or velocity data for the motor shaft 126. In another configuration, the optional sensor 115 comprises a speed sensor, or the combination of a speed sensor and an integrator to determine the position of the motor shaft.

In yet another configuration, the optional sensor 115 comprises an auxiliary, compact direct current generator that is coupled mechanically to the motor shaft 126 of the motor 117 to determine speed of the motor shaft 126, where the direct current generator produces an output voltage proportional to the rotational speed of the motor shaft 126. In still another configuration, the optional sensor 115 comprises an optical encoder with an optical source that transmits a signal toward a rotating object coupled to the shaft 126 and receives a reflected or diffracted signal at an optical detector, where the frequency of received signal pulses (e.g., square waves) may be proportional to a speed of the motor shaft 126. In an additional configuration, the optional sensor 115 comprises a resolver with a first winding and a second winding, where the first winding is fed with an alternating current, where the voltage induced in the second winding varies with the frequency of rotation of the rotor.

In one embodiment, the position/motion estimator (358 or 458) may be associated with the secondary processing module 116, such as integrated in the secondary processing module or receiving one or more current phase measurements (e.g., ia, ib, and ic) outputted by the secondary processing module 116. As illustrated, the position/motion estimator (358 or 458) is coupled between the phase converter 113 and the current regulation controller 111, such that certain calculations, estimations or determinations can be made in a synchronous d-q axis reference frame, in a stationary reference frame, or both.

In accordance with one embodiment, a position/motion estimator (358 or 458) supports control of a permanent magnet machine by estimating one or more of the following: rotor position data, rotor speed or rotor velocity data, and rotor acceleration data (collectively position and motion data) based upon the current measurements of one or more phase outputs. The position/motion estimator (358 or 458) or a state evaluator may be stored in a data storage device 260 or implemented by software instructions provide to one or more electronic data processors 264.

In one embodiment, a state evaluator is incorporated within the position/motion estimator (358 or 458) or in communication with the rotor velocity or rotor speed estimated by the position/motion estimator (358 or 458). The state evaluator is adapted to determine whether the machine is operating within a first speed range or a second speed range, where the second speed range is greater than the first speed range. Further, in certain embodiments, the state evaluator determines whether the machine is operating within a transition speed range between or overlapping partially with the first speed range, the second speed range or both.

In the first speed range, the position/motion estimator may estimator rotor position and motion data based on Volts per frequency (e.g., Volts per Hertz), or other open-loop control techniques in accordance with a second mode. Alternately, in the first speed range, the position/motion estimator could control current or voltage injection into the windings to facilitate back electromotive force estimations at lower rotor speeds. In the second speed range, the position/motion estimator may estimate rotor position and motion data based on the back electromotive force (EMF) in accordance with a first mode that is compatible with precise field-oriented control (FOC, such as space-vector-pulse-width-modulation (SVPWM)) of the motor torque, position and motion.

A sensor (e.g., a sensing circuit 124) is configured to sense current, of one or more output phases of an inverter. In one embodiment, the sensor (e.g., sensing circuit 124) comprises a current sensor or voltage sensor combined with a voltage-to-current converter (e.g., unity gain voltage-to-current amplifier). The sensed current is associated with or indicative of back electromotive force of the machine. As illustrated, an analog-to-digital converter 122 converts one or more measured or observed current phase outputs into digital signals for processing by one or more electronic data processors.

In the digital domain, a converter or electronic data processor can convert the digital sensed current into current vectors associated with a stationary reference frame. The converter may receive three phase current inputs or inputs in the d-q axis reference frame for the conversion into the stationary reference frame.

In the position/motion estimator or by the electronic data processor, the digital converted, sensed current vectors are used in a current model to estimate back EMF vectors. A vector tracking observer 362 or the electronic data processor is adapted to mix (e.g., heterodyne or apply a vector cross product) the back-EMF vectors and to apply the mixed (e.g., heterodyned) back EMF vectors to a preliminary inertial model. A secondary observer 364 or the data processor is adapted to apply the output of the preliminary inertial model to a secondary inertial model in the second speed range to estimate position or motion data (e.g., smoothed position of the rotor of the machine versus time, velocity, acceleration).

As indicated above, a state evaluator is adapted to determine whether the machine is operating within a first speed range or a second speed range, where the second speed range is greater than the first speed range.

In the second speed range of the rotor, back-EMF amplitude in a permanent magnet synchronous machine (PMSM) or motor is proportional to the rotor speed; hence, there is a constraint on the low speed limit in which back-EMF tracking can estimate an accurate rotor position. A back-EMF tracking module can estimate the rotor position in a second speed range (e.g., from medium to high speed operation).

Volts per frequency control mode, such as V/Hz (Volts/ Hertz) control mode, can be used to control the rotor velocity machine within a first speed range, such as at startup of the motor from zero speed to a first speed threshold. In practice, the first speed threshold may be set to an upper limit of first speed range or lower speed range.

Field-oriented control mode (e.g., space-vector-pulse-width-modulation (SVPWM) control mode) can be used to control the rotor velocity machine within a second range that is greater in rotor velocity that the first range. The second range has a second speed threshold that may be set to a lower limit of the second speed range. The second speed range may encompass a medium-speed range or a high-speed range. V/Hz does not require position and speed feedback to operate and is compatible with control of the permanent magnet machines or other non-reluctance machines. However, V/Hz control is limited because it is an open-loop control method.

In an alternate embodiment, V/Hz mode can be used to control the rotor velocity of the machine when the back-electromotive feedback speed (BMEF) is not available to has quality (e.g., observed signal-to-noise ratio) that falls below a quality threshold (e.g., minimum signal to noise ratio).

V/Hz control avoids variation in the magnetic field strength by varying the applied voltage with a corresponding frequency to maintain a V/Hz ratio that is generally constant or within a certain range. For example, or each target rotor velocity, the V/Hz control can be represented as a quadratic function of rotor velocity and torque. In some applications, the torque at startup is associated with maximum loading capability.

For the first speed range of the rotor or in accordance with the first mode, the position/motion estimator can estimate the position and motion of the rotor in accordance with the following V/Hz control equations:

$$V_q = \omega^* \lambda_m; V_d = 0,$$

where $V_q$ is the quadrature-axis voltage, $V_d$ is the direct axis voltage, $\omega$ is electrical rotor speed in radians/second, $\lambda_m$ is the flux linkage of the permanent magnets of the machine.

The machine d-q voltage equations can be written as:

$$V_q = I_q^* r_s + \omega L_s I_d + \omega \lambda_m,$$

$V_d = I_d * r_s - \omega L_s I_q$, and $V_q^2 + V_d^2 - [(\omega^2 L_s + R^2)i_d^2 2\omega^2 \lambda_{pm} L_s i_d + (\omega^2 L_s^2 + R^2)i_q^2 + 2R\omega\lambda_{pm}i_q] = 0$ where $V_q$ is the quadrature-axis voltage, $I_q$ is the quadrature-axis current, $V_d$ is the direct axis voltage, $I_d$ is the direct-axis current, R or $r_s$ is the resistance of a phase of the stator windings, ω is electrical rotor speed (e.g., in radians/second), $L_s$ is the inductance of the stator, $\lambda_m$ or $\lambda_{pm}$ is the flux linkage of the permanent magnets in the electric machine.

The equation can be limited to real solutions and rewritten as a quadratic function as follows:

$$f(\omega, i_q) = (\omega^2 L_s^2 + R^2)i_q^2 + 2R\omega\lambda_{pm}i_q - \frac{\omega^4 \lambda_{pm}^2 L_s^2}{(\omega^2 L_s^2 + R^2)} \leq 0,$$

where ω is electrical rotor speed (e.g., in radians/second), $L_s$ is the machine inductance, R is the resistance of one phase of the stator windings, $i_q$ is the quadrature-axis current, $\lambda_{pm}$ is the flux linkage of the permanent magnets of the electrical machine.

In terms of torque, or replacing quadrature-axis current ($I_q$) with commanded torque ($T_e$) in the equation above:

$$f(\omega, T_e) = \frac{(\omega^2 L_s^2 + R^2)}{k_t^2} T_e^2 + \frac{2R\omega\lambda_{pm}}{k_t} T_e - \frac{\omega^4 \lambda_{pm}^2 L_s^2}{(\omega^2 L_s^2 + R^2)} \leq 0,$$

where $k_t$ is sampling time interval.

In the V/Hz control mode, for a fixed speed operating point and known load state, θdiff, Vd, Vq can be calculated with a certain corresponding K. If the load state is below a load threshold, then the θdiff is approximately zero, the transition between V/Hz and field oriented control (FOC), such as space vector pulse-width modulation control, is simplified for aligning shaft position for the transition. The transition between the V/Hz control and FOC may be regarded as a shaft-alignment state. FOC can use the direct-axis current vector to define magnetic flux of the motor and the quadrature-axis current vector to define torque. The V/Hz control module is configured to cooperate with the FOC control module to achieve a smooth transition between V/Hz control and FOC.

Volts per frequency (V/F) control mode, such V/Hz control mode, or will be used to spin up the machine (e.g., motor 117) from zero speed and once the rotor speed reaches a set threshold it will automatically transition to/from the position sensorless field oriented control. The V/F control mode controls the rotor speed of a rotor based on a constant voltage/frequency ratio or a range of voltage/frequency ratio to maintain efficient operation of the motor 117.

Figure 2:
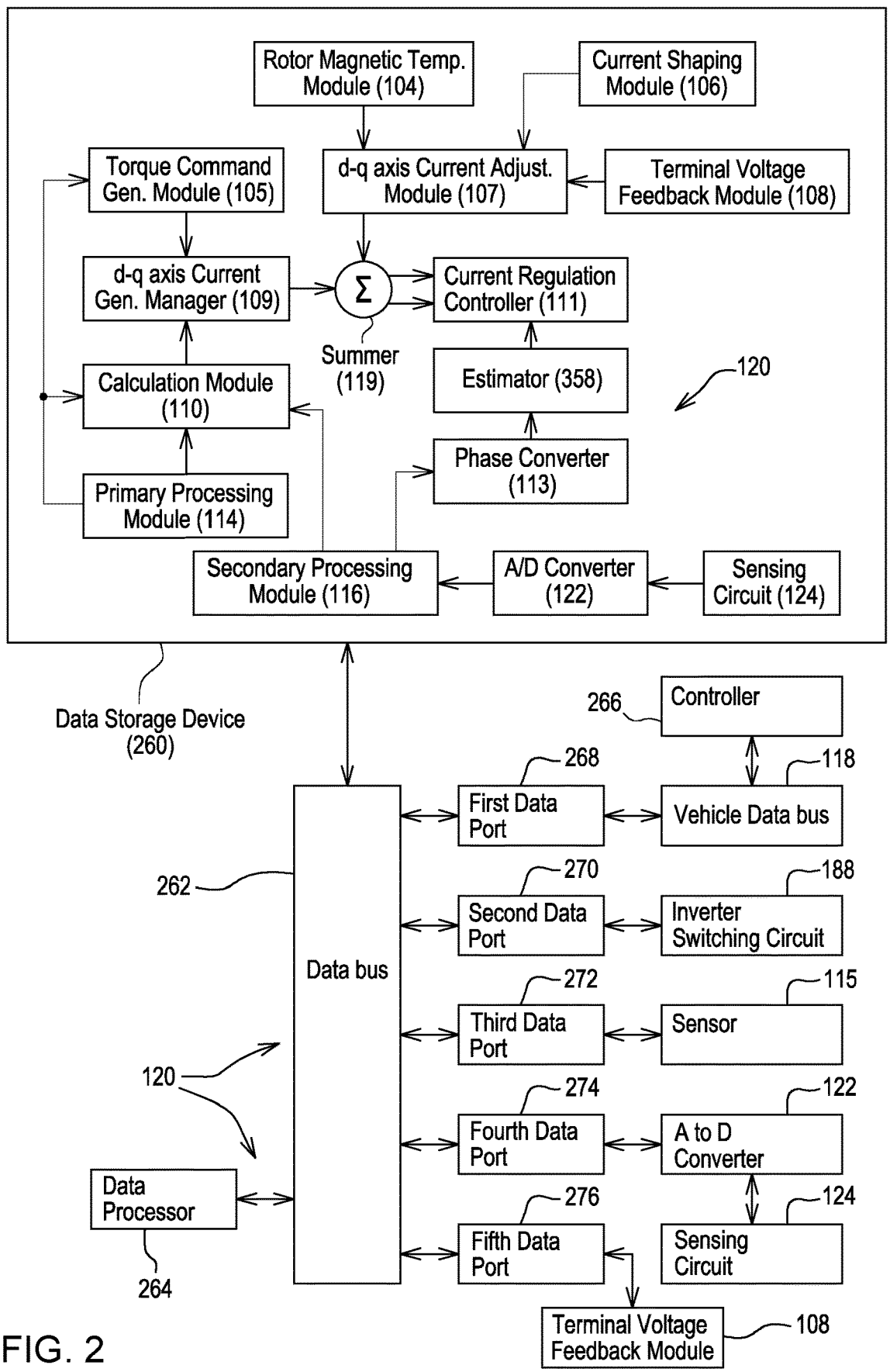
FIG. 2 is one possible illustrative example a block diagram of a system for controlling an electric machine, which is consistent with FIG. 1.

In FIG. 2, the electronic data processing system 120 comprises an electronic data processor 264, a data bus 262, a data storage device 260, and one or more data ports (268, 270, 272, 274 and 276). The data processor 264, the data storage device 260 and one or more data ports are coupled to the data bus 262 to support communications of data between or among the data processor 264, the data storage device 260 and one or more data ports.

In one embodiment, the data processor 264 may comprise one or more of the following electronic components: an electronic data processor, a microprocessor, a microcontroller, a programmable logic array, a field programmable gate array (FPGA), a logic circuit, an arithmetic logic unit, an application specific integrated circuit, a digital signal processor (DSP), a proportional-integral-derivative (PID) controller, or another data processing device. The above electronic components may be interconnected via one or more data buses, parallel data buses, serial data buses, or any combination of parallel and serial data buses, for example.

The data storage device 260 may comprise any magnetic, electronic, or optical device for storing data. For example, the data storage device 260 may comprise an electronic data storage device, an electronic memory, non-volatile electronic random-access memory, one or more electronic data registers, data latches, a magnetic disc drive, a hard disc drive, an optical disc drive, or the like.

Figure 3:
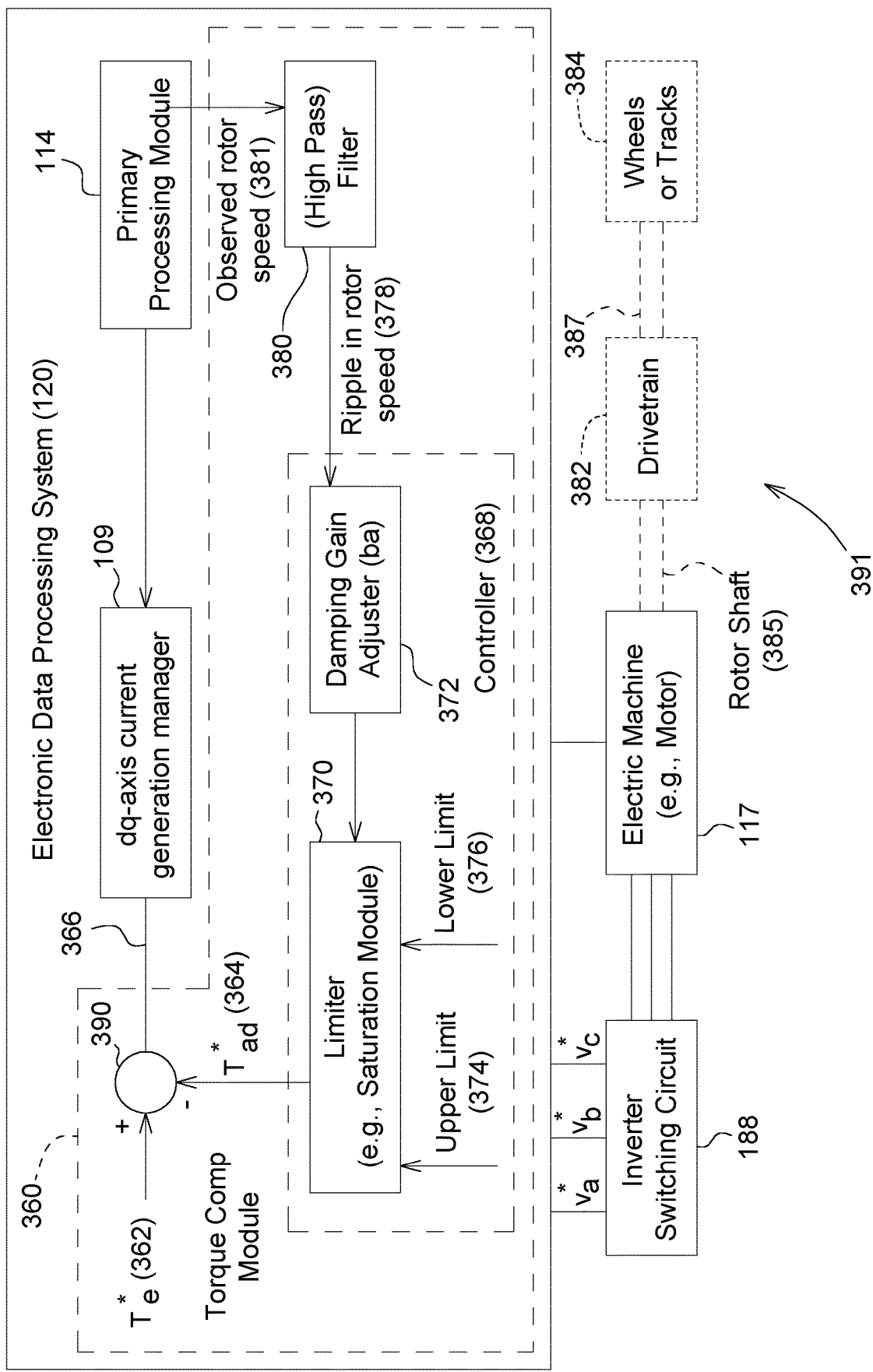
FIG. 3 is a block diagram of a first embodiment of a torque compensating module in accordance with the disclosure of FIG. 1 and FIG. 2.

In FIG. 3, the torque compensating module 360 determines one or more of the following outputs: (a) commanded compensating torque, or (b) torque error or difference between commanded torque and the commanded compensating torque, or both the commanded compensating torque and the torque difference. In turn, torque compensating module 360 is capable of communicating with (other modules of) the electronic data processing system 120 or the dq-axis current generation manager 109 of the electronic data processing system 120. The dq-axis current generation manager 109 receives and observed rotor speed from an optional rotor speed sensor (e.g., encoder, resolver or magnetic field sensor) or from the primary processing module 114 (e.g., via sensorless processing of measured, observed voltages or currents of the electric machine alternating current terminals). The electronic data processing system 120 provides commanded voltages or currents to the inverter switching circuit 188, to generate alternating current signals or pulse-width modulated (PWM) control signals to the electric machine (e.g., in the motoring mode) to control the electric machine (e.g., electric motor) 117 consistent with the commanded torque and commanded torque error (e.g., which is generally minimized) to reduce, eliminate or mitigate any mechanical oscillation (e.g., low frequency mechanical oscillation, such as between 5 Hertz (Hz) and 500 Hz or between 5 Hz and 50 Hz) that might otherwise occur in conjunction with the electromechanical system 391. The blocks of the electronic data processing system are more completely illustrated in FIG. 1 and FIG. 2.

As shown in FIG. 2, the data ports comprise a first data port 268, a second data port 270, a third data port 272, a fourth data port 274 and a fifth data port 276, although any suitable number of data ports may be used. Each data port may comprise a transceiver and buffer memory, for example. In one embodiment, each data port may comprise any serial or parallel input/output port. Like reference numbers in FIG. 1 and FIG. 2 indicate like elements or features.

In one embodiment as illustrated in FIG. 2, the first data port 268 is coupled to the vehicle data bus 118. In turn, the vehicle data bus 118 is coupled to the controller 266. In one configuration, the second data port 270 may be coupled to the inverter circuit 188; the third data port 272 may be coupled to the sensor 115; the fourth data port 274 may be coupled to the analog-to-digital converter 122; and the fifth data port 276 may be coupled to the terminal voltage feedback module 108. The analog-to-digital converter 122 is coupled to the sensing circuit 124.

In one embodiment of the data processing system 120, the torque command generation module 105 is associated with or supported by the first data port 268 of the electronic data processing system 120. The first data port 268 may be coupled to a vehicle data bus 118, such as a controller area network (CAN) data bus. The vehicle data bus 118 may provide data bus messages with torque commands to the torque command generation module 105 via the first data port 268. The operator of a vehicle may generate the torque commands via a user interface, such as a throttle, a pedal, a controller 266, or other control device.

In certain embodiments, the sensor 115 and the primary processing module 114 may be associated with or supported by a third data port 272 of the data processing system 120.

In accordance with one embodiment, an inverter system or control system for mitigating oscillation of an electric motor that drives a load comprises a torque command generation module 105 for receiving a commanded torque from an operator of a vehicle. The torque command generation module 105 may incorporate the torque compensating module 360 within the electronic data processing system 120. As illustrated in FIG. 3, a torque damping module or torque compensating module 360 is configured to receive the commanded torque (e.g., $T^*_e$) and to generate a commanded compensating torque (e.g., $T^*_{ad}$, active damping torque (to dampen any mechanical oscillation or resonance of the electric machine 117 (e.g., electric motor) based on the observed rotational speed of the electric machine 117. As used throughout this document, the torque compensating module is regarded as synonymous with the torque damping module.

In FIG. 3, the torque damping module 360 comprises a summer 390, a filter 380 (e.g., digital filter of order greater than one, such as a second order filter or third order filter), a gain adjuster 372 and a limiter 370. A summer 390 receives the commanded torque ($T^*_e$) 362 and a commanded compensating torque 364 ($T^*_{ad}$) and determines the sum or difference of the commanded torque 362 and the commanded compensating torque 364 as output. In turn, the output of the summer 390 is capable of communicating with the electronic data processing system 120 or the dq-axis current generation manager 109 of the electronic data processing system 120. The dq-axis current generation manager 109 receives and observed rotor speed from an optional rotor speed sensor (e.g., encoder, resolver or magnetic field sensor) or from the primary processing module 114. The electronic data processing system 120 provides commanded voltages or currents to the inverter switching circuit 188, to generate alternating current signals or pulse-width modulated (PWM) control signals to the electric machine 117 (e.g., in the motoring mode) to control the electric machine consistent with the commanded torque 362 and commanded torque error 366 (e.g., which is generally minimized) to reduce, eliminate or mitigate any potential mechanical oscillation associated with an electromechanical system 391, which may comprise the electric machine 117, its rotor shaft 385, the drive train 382, mechanical coupler 387 of rotational energy, and drive wheels 384 or tracks. The blocks or modules of the electronic data processing system 120 are more completely illustrated in FIG. 1 and FIG. 2.

Here, in FIG. 3, the electric machine 117 has a rotor or rotor shaft 385 that is mechanically coupled to the drive train 382 of the vehicle. In turn, the drive train 382 is mechanically coupled, directly or indirectly, via a coupler 382 to drive or impart rotational energy to the drive wheels 384 during a motoring mode of the electric machine (and its inverter). In some embodiments, the drive train 382 can transmit rotational energy from the drive wheels 384 to the electric machine in a braking mode or in a power regeneration mode of the electric machine 117 (and its inverter).

In one aspect of the disclosure, the torque compensation module 360 comprises a filter 380, where the filter has a bandpass or high-pass filter response of magnitude versus frequency, wherein the input to the filter comprises the observed rotational speed of the motor ($\omega$) and wherein the output of the filter comprises an isolated oscillation or ripple (e.g., a time-averaged mean or average ripple component $\bar{\omega}$) of the observed rotational speed with a removed or attenuated DC offset in the compensating torque (e.g., $T^*_{ad}$). In alternate embodiments, the observed rotational speed of the motor may be replaced by the electrical rotational speed of the motor, which can be converted to the observed rotational speed through known relationships or equations that can depend upon the construction and design of the electric machine 117.

Further, a gain adjuster 372 (e.g., damping gain adjuster) is coupled to the output of the filter 380, where the gain adjuster 372 configured to determine a gain (or magnitude) of the commanded compensating torque based on the isolated oscillation or ripple of the observed rotational speed. For example, the gain adjuster 372 is configured to determine a gain (or magnitude) of the commanded compensating torque based on the isolated oscillation or ripple of the observed rotational speed for a sampling interval or that is averaged or integrated over a series of successive sampling periods (e.g., within a time window).

In one embodiment, a limiter 370 is configured to restrict the gain (ba) to a lower limit of the gain and an upper limit of the gain based on integration of the ripple of the observed rotational speed or proportional integral control of the ripple of the observed speed (e.g., for a sampling interval or a series of successive sampling intervals). The upper limit sets a maximum gain because if the gain is too high, the system could otherwise lose stability at higher rotor speed. Similarly, the lower limit sets a minimum gain because if the gain is too low, the torque error and associated mechanical resonance may be noticeable to the operator of the vehicle; may tend to reduce the longevity of the electric machine 117 or the drive train 387 that couples the rotor 385 of the electric machine 117 to the wheels 384 or tracks that engage the ground. The drive train 382 may comprise any of the following: shafts, clutches, hydraulic torque converters, discs, friction plates, and gears, belts, chains, drive shafts, differentials, gear box transmissions, or infinitely variable transmissions. In certain embodiments, the limiter 370 may comprise a saturation module to maintain the saturation of maximum suppression of mechanical oscillation based on the ripple or filter output of the filter 380.

The filter 380 may be configured in accordance with various examples, which may be applied separately or cumulatively.

Under a first example, the filter 380 comprises an filter selected from the group consisting of a digital finite impulse response (FIR) filter (e.g., in FIG. 7), an infinite impulse response (IIR) filter, a hybrid or combination of the FIR and IIR filter (e.g., in FIG. 8), or a cascaded, integrator comb filter of a second order or third order.

Under a second example, the filter 380 may comprise an analog filter or a digital representation, or an emulation of an analog filter, based on any of the following: (a) analog capacitive-resistance, high pass filter with a pair of input terminals and a pair of output terminals, where the pair of input terminals has a first input terminal and a second input terminal, where the pair of output terminals has a first output terminal and a second output terminal, where a capacitor is in series between the first input terminal and the first output terminal, and where a resistor is in parallel with or across the first output terminal and the second output terminal; or (a) analog resistance-inductance, high pass filter with a pair of input terminals and a pair of output terminals, where the pair of input terminals has a first input terminal and a second input terminal, where the pair of output terminals has a first output terminal and a second output terminal, where a resistor is in series between the first input terminal and the first output terminal, and where an inductor is in parallel with or across the first output terminal and the second output terminal Under a third example, the filter 380 has a transfer function that is based on cascaded high pass filters in accordance with the following:

$$H(s) = \frac{s}{s+1} * \frac{s}{1+\frac{1}{r}},$$

where H is a transfer function in the s frequency domain (or Laplace transformation) and r is resistance or damping constant. The first right-hand term, $$\frac{s}{s+1},$$

represents a first stage or first high pass filter, whereas the second right-hand term, $$\frac{s}{1+\frac{1}{r}},$$

represents a second stage or second high pass filter, which is cascaded with the first stage. Although a specific transfer function is provided for illustrative purposes, any suitable transfer function may be used for a second or third order digital filter in a band-pass configuration, a notch filter configuration, or a in a high-pass configuration.

In practice, the suitable transfer function of the filter 380 may consider the gain (ba) of the compensating torque that provides control stability of the electromechanical system 391, such as the components or blocks of FIG. 3, where the stability can be analyzed via Bode plots, pole-zero diagrams (e.g., root locus diagram in FIG. 10), or commercially available computer modeling/simulation tools techniques. In one embodiment, the gain adjuster 372 multiples the gain (ba) by the ripple or filter output of filter 380, which is indicative of the potential or actual ripple, mechanical oscillation or fluctuation of the observed rotational speed for each sampling interval or set of sampling intervals.

In one configuration, a combination of the gain adjuster 372 and the limiter 370 comprises a proportional integral controller or a proportional integral differential controller that is configured to schedule the gain based on detecting whether the electric motor 117 is operating in a first speed range or a second speed range that is different than the first speed range. In one embodiment, the speed range of the rotor can be estimated by the primary processing module 114 or by a rotational sensor (e.g., encoder, resolver, and or magnetic field sensor), or provided by the position/motion estimator 358. The first speed range comprises a low speed range and wherein the second speed range comprises a high speed range.

In one embodiment, a proportional integral controller mean a feedback control method in which data that is proportional to an error (e.g., torque error) is superimposed on a ramp function obtained by integrating the output. In another embodiment, proportional integral controller is configured to determine an output 364 (e.g., a compensating torque or adaptive damping torque) that is proportional to a time integral of the input (e.g., based on saturated or limited damping gain). A proportional integral differential controller is configured to determine an output 364 (e.g., a compensating torque or adaptive damping torque) that is proportional to a linear combination of the input and time rate-of-change of the input (e.g., based on saturated or limited damping gain).

In one embodiment, a controller 368 comprises a combination of the gain adjuster 372, the limiter 370 and an electronic data processor 264. For example, the controller 368 comprises proportional integral controller or a proportional integral differential controller that is configured to estimate, determine or schedule the gain (e.g., damping gain) to damp the mechanical oscillation of the electromechanical system 391 (e.g., electric machine 117, its rotor shaft 385, the driver train 382, the coupler 387 and the drive wheels 387, or tracks) based on detecting whether the electric motor 117 is operating in a first speed range or a second speed range that is different than the first speed range. The first speed range comprises a low speed range and the second speed range comprises a high speed range, where the speed range may be characterized in a Bode diagram or a pole-zero diagram (e.g., root locus diagram) to determine a target operational parameters for stability and/or performance. Typically, the pole-zero diagram will apply to a corresponding speed range of the rotor, whereas the Bode diagram may characterize the magnitude and phase of a signal over an entire speed range or operational range of the rotor of the electric machine. Various techniques may be used separately or cumulatively to determine a suitable gain for the compensating torque component.

In another embodiment, a controller 368 comprises a combination of the gain adjuster 372, the limiter 370 and an electronic data processor 264. For example, the controller 368 comprises proportional integral controller or a proportional integral differential controller that is configured to estimate, determine or schedule the gain (e.g., damping gain) to damp the mechanical oscillation of the electromechanical system 391 (e.g., electric machine 117, its rotor shaft 385, the driver train 382, the coupler 387 and the drive wheels 387, or tracks) based on detecting whether the electric motor 117 is operating in a first torque range or a second torque range that is different than the first torque range. For example, the torque sensor 396 (in FIG. 6) may provide a torque measurement of the rotor shaft 382 of the electric machine 117, the drive train 382 or the coupler 387, or may determine whether the torque measurement is within the first range, the second range, or otherwise. In one configuration, the first torque range comprises a low torque range and the second torque range comprises a high torque range, where the torque range may be characterized in a Bode diagram or a pole-zero diagram (e.g., root locus diagram) to determine a target operational parameters for stability and/or performance. Typically, the pole-zero diagram will apply to a corresponding torque range of the rotor, whereas the Bode diagram may characterize the magnitude and phase of a signal over an entire torque range or operational range of the rotor of the electric machine.

The controller 368, the gain adjuster 372, the limiter 370, or the data processor 264, individually or collectively, may apply various techniques, which may be used separately or cumulatively to determine a suitable gain for the compensating torque component.

Under a first technique, the controller 368, the gain adjuster 372, the limiter 370, or the data processor 264, individually or collectively, determines or estimates a suitable gain based on one or more of the following factors: a respective first root locus diagram of a real root locus component versus an imaginary root locus component that corresponds to the first speed range with a corresponding first gain that is stable relative to one or more poles (on a left-side of first root locus diagram) and a respective second root locus diagram of a real root locus component versus an imaginary root locus component that corresponds to a second speed range with a corresponding second gain that is stable relative to one or more poles (on the left-side of the second root locus diagram), or a computer model (e.g., stored in the data storage device 260 for execution by the data processor 264) of the stability of electromechanical system 391 (which comprises any combination of two or more of the following components: the electric machine 117, its rotor shaft 385, the drive train 382, the coupler 387 and/or the drive wheels 384 or tracks) with respect to the rotor speed, ground speed, rotor torque and applied torque dampening and associated damping gain of the gain adjuster 372.

Under a second technique, the controller 368, the gain adjuster 372, the limiter 370, or the data processor 264, individually or collectively, determines or estimates a suitable gain, where a Bode diagram of magnitude and phase versus rotor speed provides an indication of phase and magnitude discontinuity in a resonant frequency range that can be filtered by a digital high-pass or band-pass filter to extract or isolate a ripple (e.g., ripple component or oscillatory component representative of or indicative of a mechanical vibration) of an electromechanical system 391, which comprises any combination of two or more of the following components: the electric machine 117, its rotor shaft 385, the drive train 382, the coupler 387 and/or the drive wheels 384 or tracks) with respect to the rotor speed, ground speed, rotor torque and applied torque dampening and associated damping gain of the gain adjuster 372. For example the Bode diagram or similar analytical tools may be used to determine a filtering bandwidth (e.g., half-power bandwidth), central filtering frequency, and/or filtering magnitude.

Under a third technique, the controller 368, the gain adjuster 372, the limiter 370, or the data processor 264, individually or collectively, determines or estimates a suitable gain without resulting in, or being skewed by, a material direct-current (DC) offset in the commanded torque ($T^*_e$), in the compensating torque ($T^*_{ad}$) or both, based upon which the electric machine is controlled (e.g., driven in a motoring mode or generating power in a regeneration or braking mode).

Under a fourth technique, the controller 368, the gain adjuster 372, the limiter 370, or the data processor 264, individually or collectively, determines or estimates the acceleration of the electric machine 117, while maintaining the damping of the mechanical oscillation arising from any mismatch, or proportional misalignment, between the rotor speed of the rotor shaft 385 the electric machine 117 and the rotational speed of the wheels 384 (e.g., outer wheels, where there is a differential axel or turning radius) or tracks with respect to the ground. Typically, the rotational speed of the rotor shaft 385 can be targeted to be substantially identical with, or aligned with (e.g., proportional to) the rotational speed of the wheels 384, taking into account any relative gear ratio within the drive train 382 or coupler 387.

The load on the electric machine 117 comprises a drivetrain 387 of the vehicle that transmits rotational energy from a rotor shaft 385 of the electric machine 117 to wheels 384 or tracks that engage the ground. For instance, in one illustrative configuration the drivetrain 382 comprises a transmission and differential gearbox, although in alternate embodiments the electric machine 117 may comprise a hub-mounted motor associated with the wheels 384 or tracks in a direct-drive or hub-gear-box drive configuration.

Figure 4:
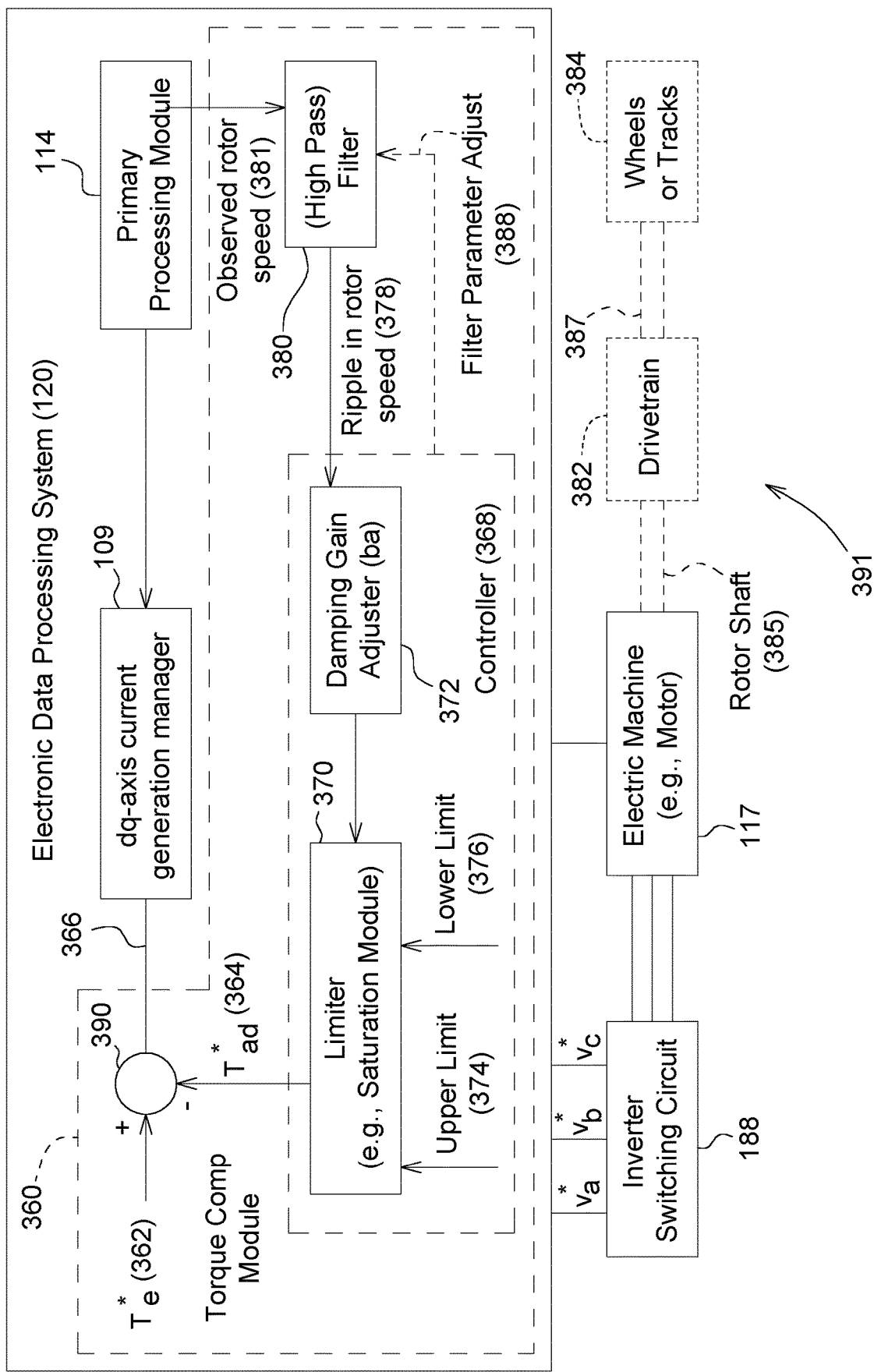
FIG. 4 is a block diagram of a second embodiment of a torque compensating module in accordance with the disclosure of FIG. 1 and FIG. 2.

The system of FIG. 4 is similar to the system of FIG. 3, except the controller 368 or torque compensation module 360 provides filter parameters or filter parameter adjustment (e.g., differential to the previous filter parameters) to adaptively control one or more of the following: (a) bandwidth of the filter 380, such as the half-power bandwidth of the filter, (b) central frequency of the filter 380, (c) a minimum passband frequency and a maximum passband frequency of the filter 380, (d) magnitude versus frequency response of the filter to further address transients in the mechanical oscillatory component of the electromechanical system 391, torque error 366 and/or to minimize the torque error 366 outputted at the summer 390. In one embodiment, the filter parameters comprise digital filter coefficients, such as the filter coefficients (e.g., $a_a$, $a_b$, $a_c$) for the second order finite impulse response (FIR) filter of FIG. 7 or the filter coefficients (e.g., $a_1$, $a_2$, $b_0$, $b_1$, $b_2$) for the hybrid finite impulse response-infinite impulse response (FIR-IIR) filter of FIG. 8.

Figure 5:
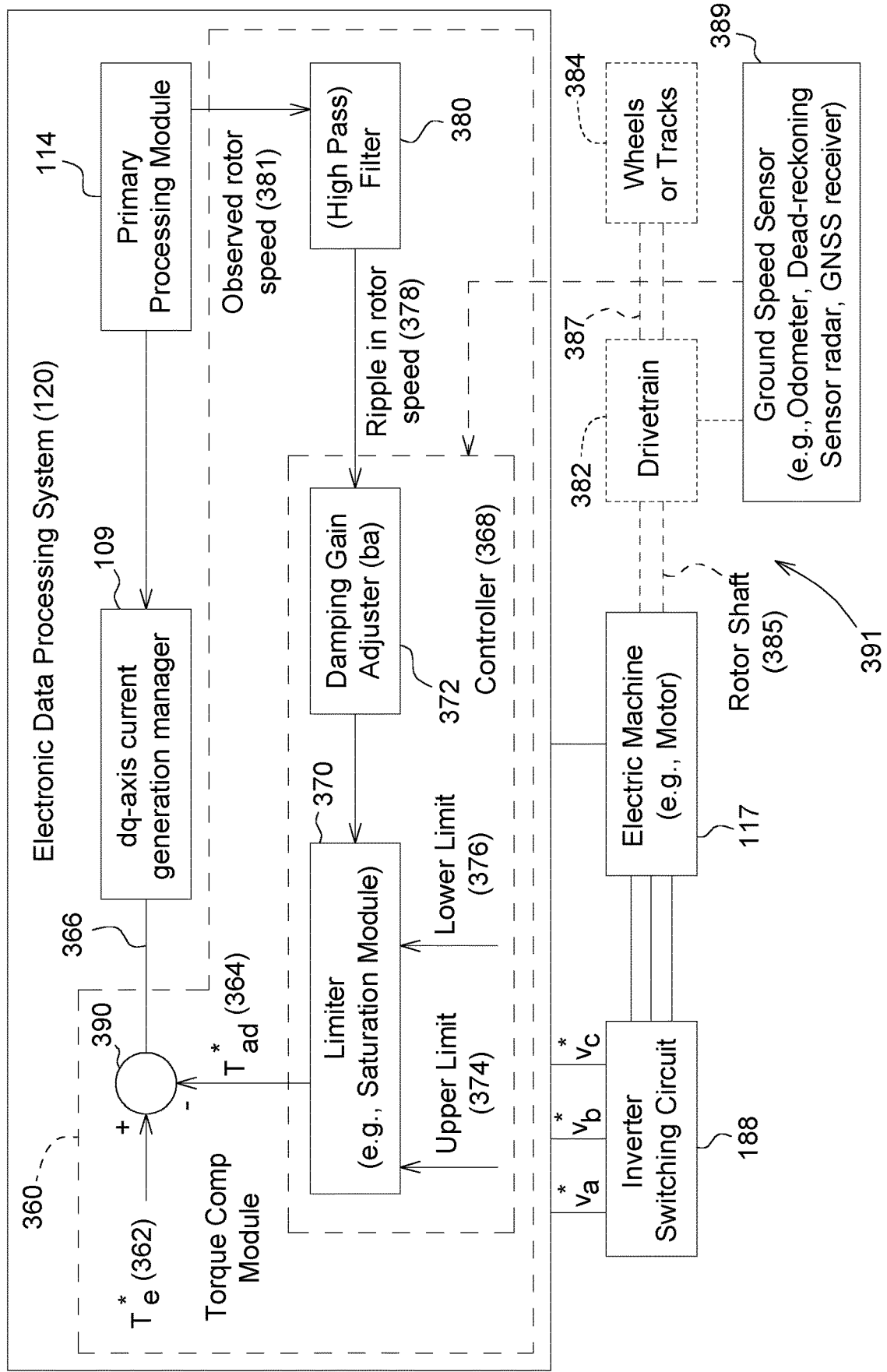
FIG. 5 is a block diagram of a third embodiment of a torque compensating module in accordance with the disclosure of FIG. 1 and FIG. 2.

The system of FIG. 5 is similar to the system of FIG. 3, except the system of FIG. 5 further comprises a ground speed sensor 389. The ground speed sensor 389 may comprise an odometer, a speedometer, a dead-reckoning sensor, radar, a location-determining receiver, a Global Navigation Satellite System (GNSS) receiver (e.g., augmented by a differential correction wireless receiver or transceiver). Typically, the odometer or speedometer can be integral with the drive train 392 or an assembly (e.g., hub) of the wheel 384 or tracks. The ground speed sensor 389 is configured to communicate with the controller 368 to determine, estimate, extract or isolate a ripple component or a mechanical oscillatory component of the electromechanical system 391. The ripple component may arise or be contributed to from any mismatch, or proportional misalignment, (e.g., referred to generally as a rotational error factor) between the rotor speed of the rotor shaft 385 the electric machine 117 and the rotational speed of the wheels 384 (e.g., outer wheels, where there is a differential axel or turning radius) or tracks with respect to the ground. Typically, the rotational speed of the rotor shaft 385 can be targeted to be substantially identical with, or aligned with (e.g., proportional to) the rotational speed of the wheels 384, taking into account any relative gear ratio within the drive train 382 or coupler 387.

Figure 6:
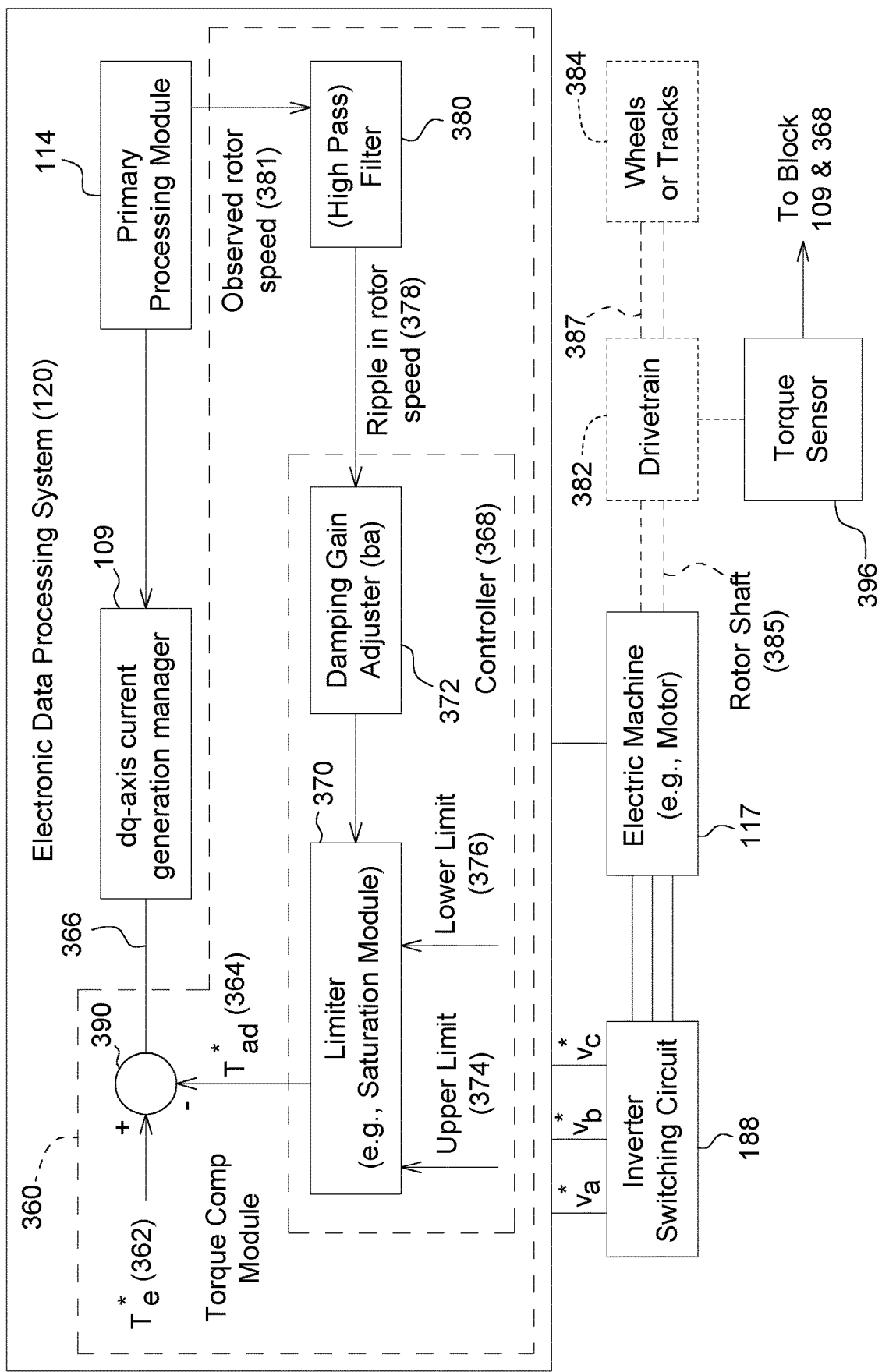
FIG. 6 is a block diagram of a fourth embodiment of a torque compensating module in accordance with the disclosure of FIG. 1 and FIG. 2.

The system of FIG. 6 is similar to the system of FIG. 3, except the system of FIG. 6 further comprises a torque sensor 396. In one embodiment, the torque sensor 396 can be integral with the rotor shaft 395, the drive train 392, the coupler 387 or an assembly (e.g., hub) of the wheel 384 or tracks. The torque sensor 396 is configured to communicate with the controller 368 to determine, estimate, extract or isolate a ripple component or a mechanical oscillatory component of the electromechanical system 391. The torque sensor 396 is optionally configured to communicate with the dq-axis current generation manager 109 to provide torque feedback indicative of secondary torque error with respect to the estimated torque 362. The ripple component may arise or be contributed to from any mismatch, or proportional misalignment, between a first torque (e.g., estimated torque by estimation of electronic data processor 264 via the alternating current terminals and respective signals of the electric machine 117) of the rotor shaft 385 the electric machine 117 and a second torque (e.g., observed torque or derived torque from the torque sensor 396) of the wheels 384 (e.g., outer wheels, where there is a differential axel or turning radius)

or tracks with respect to the ground. Typically, the first torque of the rotor shaft 385 can be targeted to be substantially identical with, or aligned with (e.g., proportional to) the second torque of the wheels 384, taking into account any relative gear ratio within the drive train 382 or coupler 387.

Figure 7:
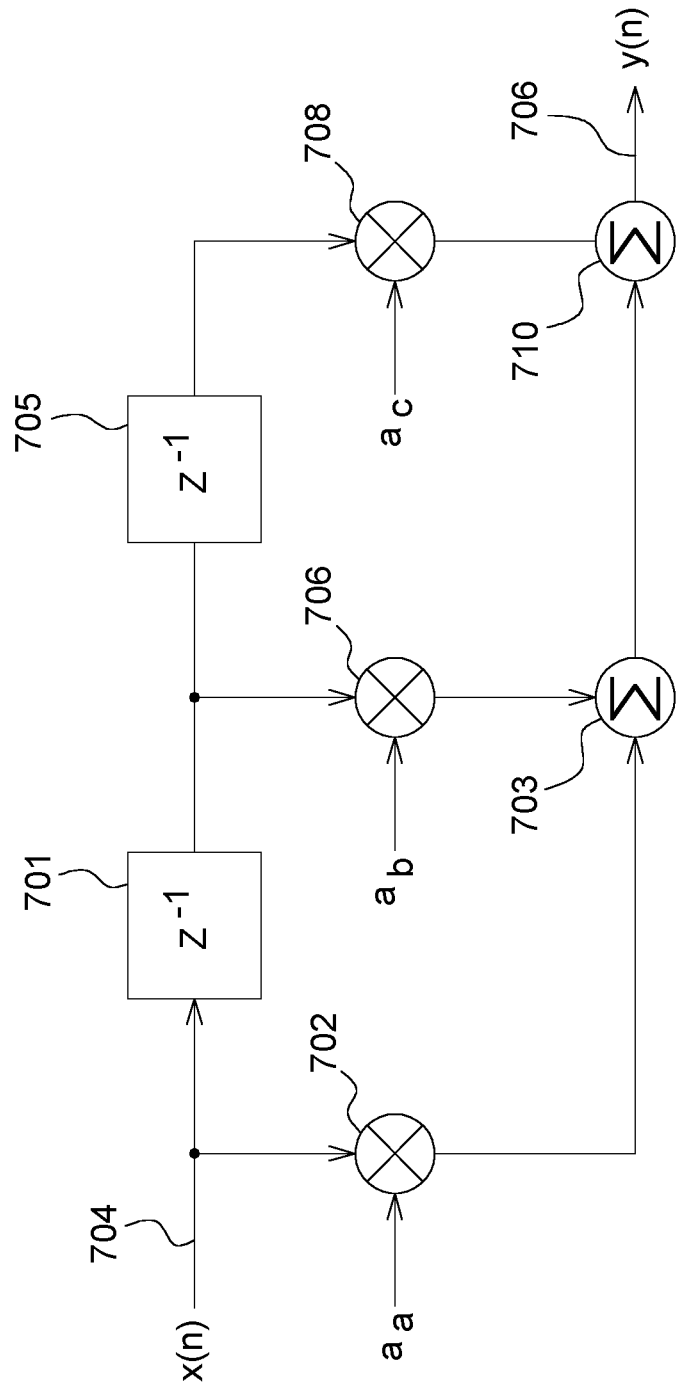
FIG. 7 is block diagram of one embodiment of a digital filter, such as a second order finite impulse response filter, within the torque compensating module.

FIG. 7 is block diagram of one embodiment of a digital filter 380, such as a second order finite impulse response filter (FIR), within the torque compensating module 360. The digital filter 380 comprises delay lines (701, 705), multipliers (702, 706, 708) or mixers, and summers (703, 710). An input node 704 is associated with an input of a first delay line 701 that is connected to an input of a first multiplier 702. The first multiplier 702 has a first tap input for inputting a first filter coefficient (e.g., $a_a$) or first filter parameter to determine the frequency versus magnitude response of the filter 380, and filter characteristics/specifications. The output of the first delay line 701 is coupled to an input of a second delay line 705 and an input of a second multiplier 706. The second multiplier 706 has a second tap input for inputting a second filter coefficient (e.g., $a_b$) or second filter parameter to determine the frequency versus magnitude response of the filter 380, and filter characteristics/specifications. An output of the second delay line 705 is associated with an input of a third multiplier 708. The third multiplier 708 has a third tap input for inputting a third filter coefficient (e.g., $a_c$) or second filter parameter to determine the frequency versus magnitude response of the filter 380, and filter characteristics/specifications. The outputs of the first multiplier 702 and the second multiplier 703 are coupled to a first summer 703. In turn, the output of the first summer 703 and the output of the third multiplier are coupled to inputs of the second summer 710, where the output node 706 is connected to the output of the second summer 710. The output at the output node 706 is the sum of the products of the last three input samples (applied to input node 704) multiplied by each respective filter coefficient ($a_a$, $a_b$, $a_c$). The FIR filter configuration of filter 380 is generally regarded as inherently stable is not based on any feedback.

Figure 8:
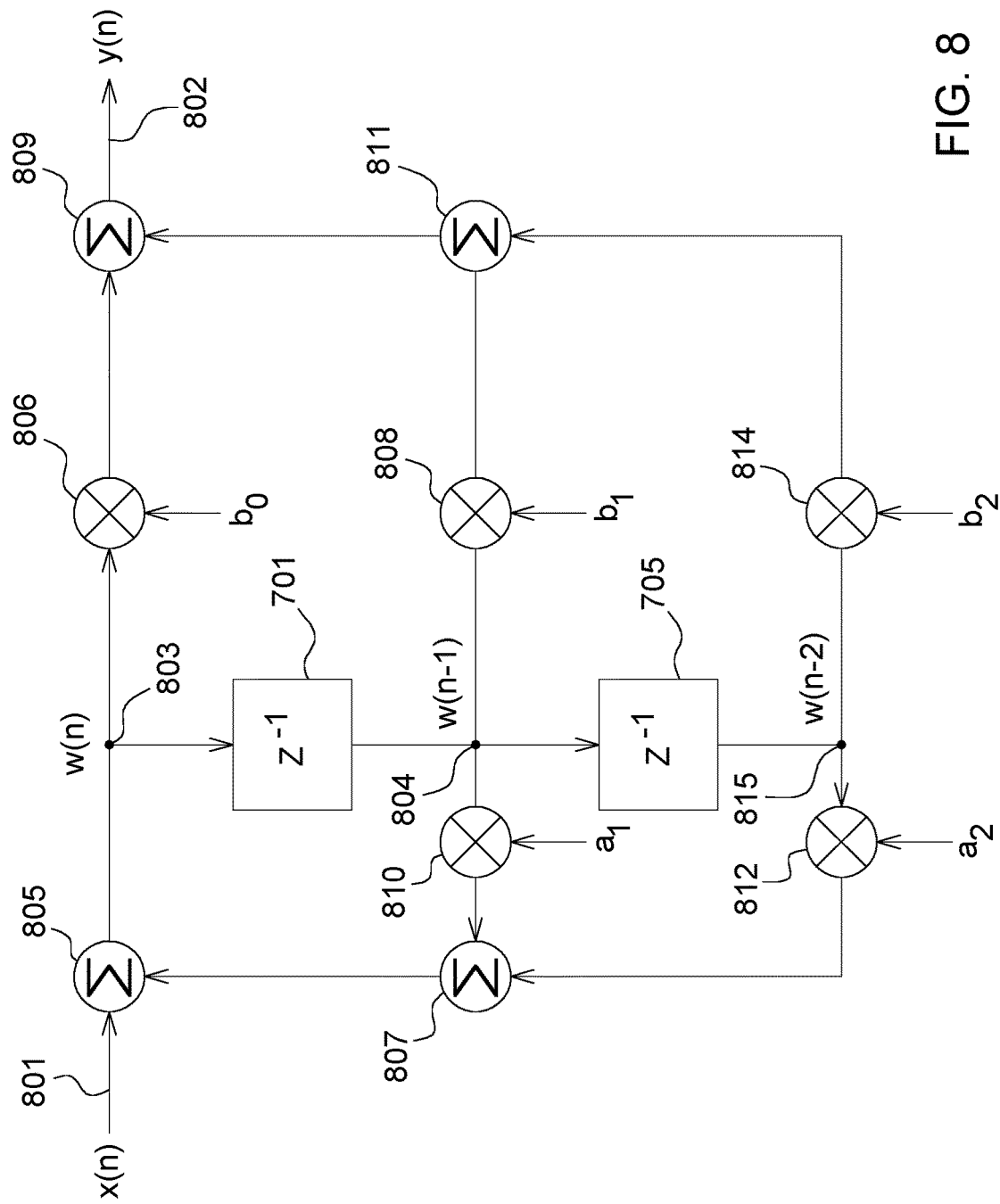
FIG. 8 is block diagram of another embodiment of a digital filter, such as a second order hybrid finite impulse response and infinite impulse response filter, within the torque compensating module.

FIG. 8 is block diagram of another embodiment of a digital filter 480, such as a second order hybrid finite impulse response (FIR) and infinite impulse response (IIR) filter, within the torque compensating module. The digital filter 480 may replace or be substituted for the digital filter 380 in any of the drawings of this document, for one or more embodiments. The filter 480 is formed by the combination of a FIR filter and a IIR filter. The digital filter 380 comprises delay lines (701, 705), multipliers (810, 812, 806, 808, 814) or mixers, and summers (805, 807, 809, 811).

In FIG. 8, an input node 801 is associated with an input of a first summer 805 that provides an output to first node 803, which is labeled w(n). An input of a first delay line 701 and an input of a first multiplier 806 are coupled to the node 803. The output of the first multiplier 806 is coupled to an input of a second summer 809 and another input of the second summer 809 is coupled to an output of a third summer 811.

The first multiplier 806 has a first tap input for inputting a first filter coefficient (e.g., $b_0$) or first filter parameter (e.g., first FIR filter coefficient) to determine the frequency versus magnitude response of the filter 480, and filter characteristics/specifications. The output of the first delay line 701 is coupled to second node 804, which is labeled w(n−1).

The second node 804 is a connection or junction of an output of the first delay line 701, an input of a second delay line 705, an input of a primary multiplier 810, and an input of a second multiplier 808. The primary multiplier 810 has a primary tap input for inputting a primary filter coefficient (e.g., $a_1$) or primary filter parameter (e.g., first IIR filter coefficient) to determine the frequency versus magnitude response of the filter 480, and filter characteristics/specifications. The output of the primary multiplier 810 is coupled to a third summer 807, which also receives input data from the first summer 805. The second multiplier 808 has a second tap input for inputting a second filter coefficient (e.g., $b_1$) or second filter parameter (e.g., second FIR filter coefficient) to determine the frequency versus magnitude response of the filter 480, and filter characteristics/specifications. The output of the second multiplier is coupled to an input of a fourth summer 811.

The third node 815 is labeled w(n−2). The third node 815 is a connection or junction of an output of the second delay line 705, an input of a second delay line 705, an input of a secondary multiplier 812, and an input of a third multiplier 814. The secondary multiplier 812 has a secondary tap input for inputting a secondary filter coefficient (e.g., $a_2$) or secondary filter parameter (e.g., second IRR filter coefficient) to determine the frequency versus magnitude response of the filter 480, and filter characteristics/specifications. The output of the secondary multiplier 812 is coupled to a third summer 807, which also receives input data from the primary multiplier 810. The third multiplier 814 has a third tap input for inputting a third filter coefficient (e.g., $b_2$) or third filter parameter (e.g., third FIR filter coefficient) to determine the frequency versus magnitude response of the filter 480, and filter characteristics/specifications. The output of the third multiplier 814 is coupled to an input of a fourth summer 811. The output of the fourth summer 811 is coupled to the input of the second summer 809. The output node 802, which is labeled y(n) is at the output of the second summer 809. The hybrid filter 480 is defined in accordance with the following equations:

$$y(n)=(b_0+b_1z^{-1}+b_2z^{-2})*w(n);$$

$$w(n)=x(n)+(a_1z^{-1}+a_2z^{-2})*w(n);$$

where x(n) is the input, y(n) is the output, w(n) is the data at the first node 803, where $b_1$, $b_2$ and $b_3$ are FIR filter coefficients, $a_1$ and $a_2$ are IIR filter coefficients, and z−1 are a delay line (e.g., of one sampling interval).

Figure 9:
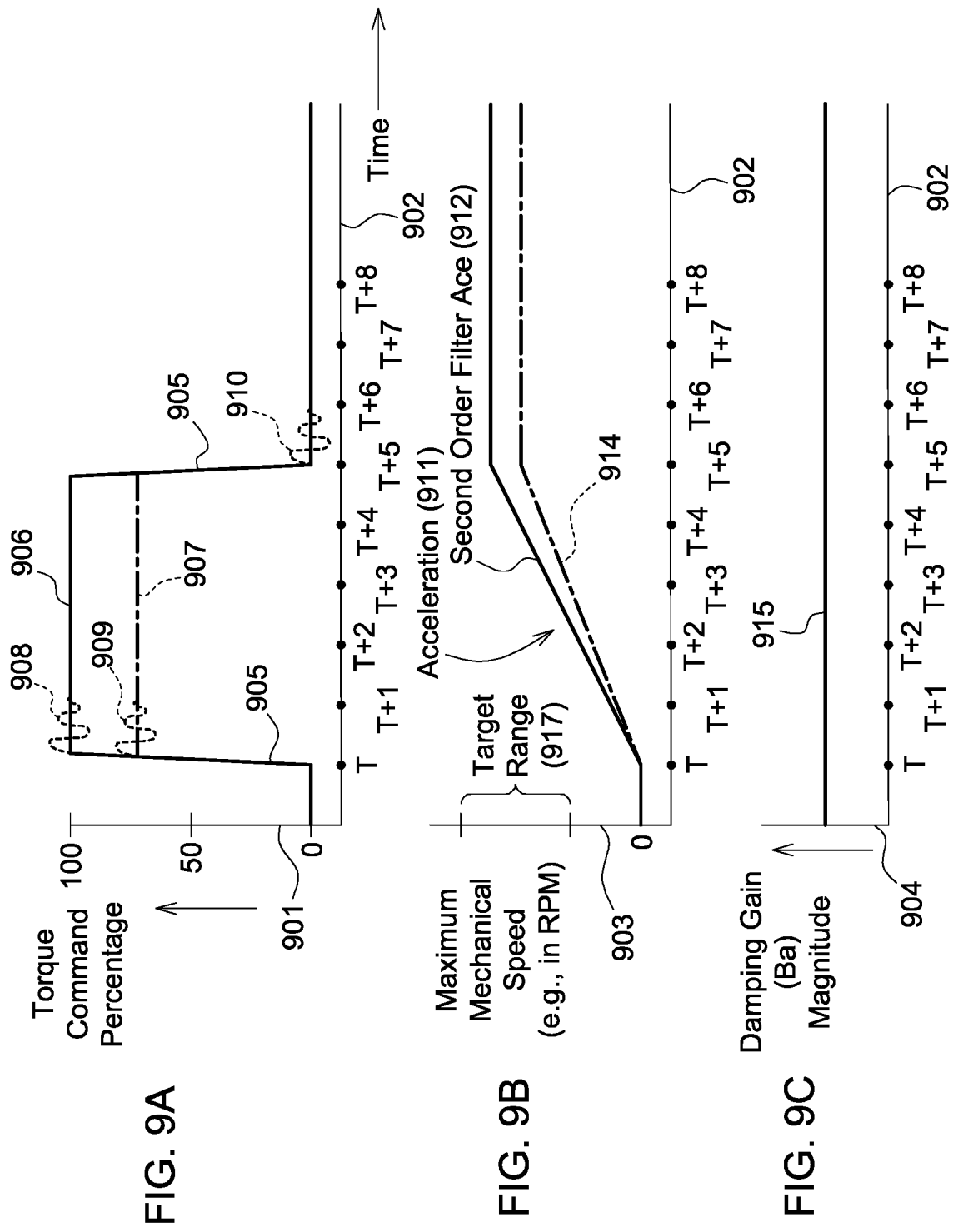
FIG. 9A illustrates a first torque command based upon a first order filter compared to a second torque command based on a second order filter of the torque compensating module, along with the potential damping of torque oscillation.
FIG. 9B illustrates a first rotor speed versus time response and a second rotor speed versus time response based on the first torque command and the second torque command, respectively, of FIG. 9A.
FIG. 9C illustrates a damping gain (Ba) which may be set to a constant value as shown, or adjusted during the torque command.

FIG. 9A illustrates a first torque command based upon a first order filter compared to a second torque command based on a second order filter of the torque compensating module, along with the potential damping of torque oscillation. The vertical axis indicates the commanded torque 901, which can be expressed a percentage of maximum commanded torque. The horizontal axis indicates time 902, in which FIG. 9A, FIG. 9B and FIG. 9B are aligned with a common time scale, included by a time, T, plus a positive integer number of sampling intervals. For example, T+1 is the time plus one sampling interval, whereas T+8 is the time plus eight sampling intervals.

In FIG. 9A, the commanded torque for a second order, third order, or higher filter order as filter 380 is indicated by the leading edge and trailing edge solid line 905 and a higher-order, maximum or peak commanded torque 906 that equals or approaches one-hundred percent. In contrast, the commanded torque for a first order filter as filter 380 is indicated by the leading edge and trailing edge solid line 905 and the alternating long-short, dashed line, which indicates a lower-order, maximum or peak commanded torque 907. The mechanical oscillation in the torque is illustrated by dashed lines 908 and 910, which are reduced, eliminated, mitigated or quelled by the compensating torque or adaptive damping torque.

FIG. 9B illustrates a first rotor speed versus time response and a second rotor speed versus time response based on the first torque command and the second torque command, respectively, of FIG. 9A. The vertical axis indicates mechanical speed 903, which can be expressed in revolutions per time period (e.g., minute). The horizontal axis indicates time 902. If the torque compensating module 360 is configured with a first order filter as the filter 380, the first acceleration response 914 is indicated by the alternating long-short, dashed line. However, if the torque compensating module 360 is configured with a second order filter as the filter 380, the second acceleration response 912 is indicated by the solid line 912.

FIG. 9C illustrates a damping gain 915 (ba or Ba) which may be set to a constant value as shown indicated by the horizontal line, or adjusted during the torque command. The vertical axis of FIG. 9C indicates the damping gain magnitude 904 (e.g., ba or Ba), whereas the horizontal axis of FIG. 9C indicates time.

Figure 10:
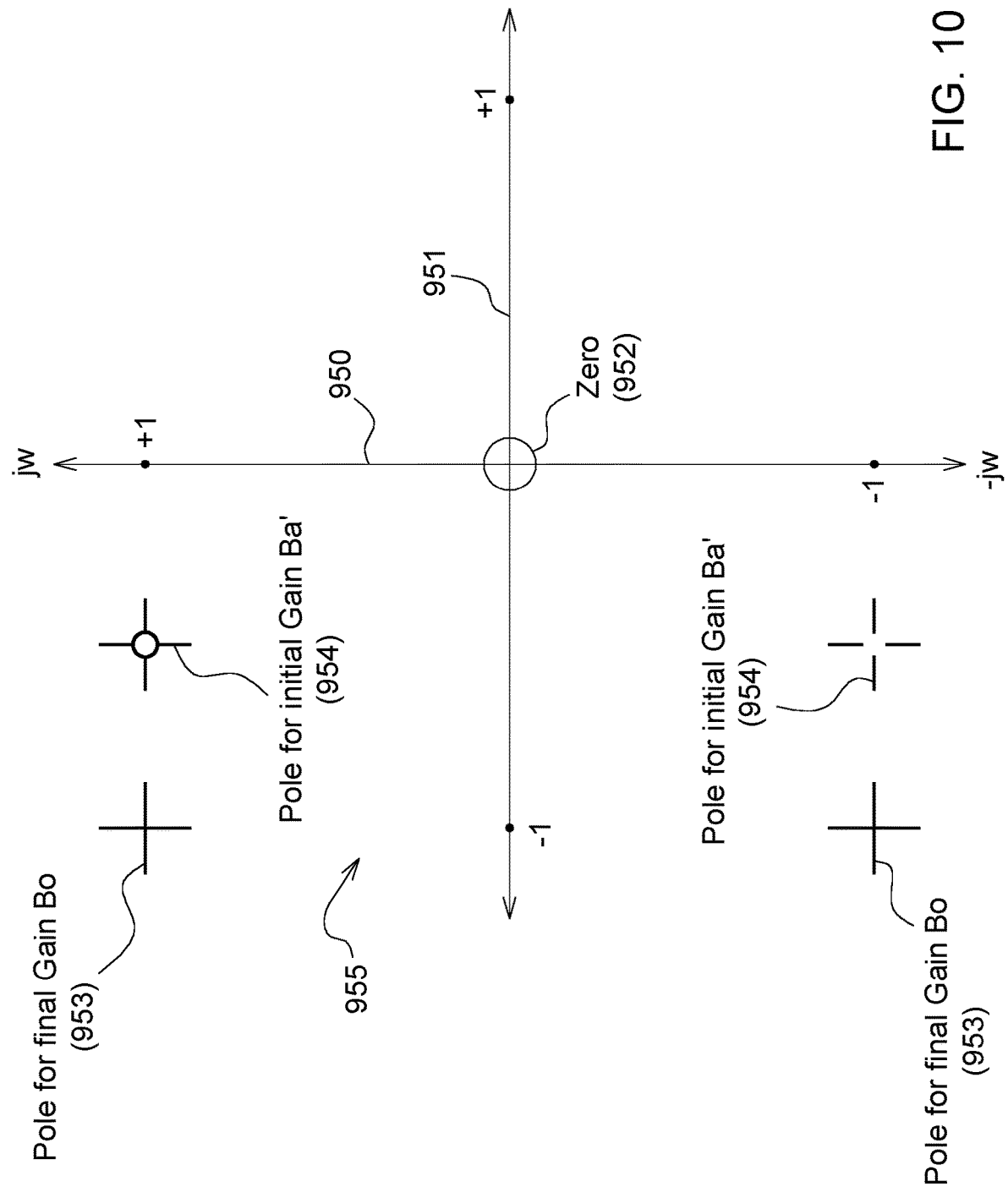
FIG. 10 is an illustrative pole-zero diagram of the electromechanical system.

FIG. 10 is an illustrative pole-zero diagram of the electromechanical system 391. The vertical axis of FIG. 10 represents the imaginary axis 950, which includes a positive portion of the imaginary axis 950, jw, and the negative portion of the imaginary axis 950, −jw. The horizontal axis represents the real axis 951, which includes a positive portion and a negative portion of the real axis 951. At the intersection of the axes (950, 951), the origin may be associated with a zero 952, whereas the poles (953, 954) for stable electromechanical system 391 are generally located to the left region 955 (or two left quadrants) to the left of the real axis 950.

As illustrated in FIG. 10, one or more initial poles 954 may be associated with an initial position on the pole-zero diagram that correspond to an initial gain or damping gain (ba); one or more final poles or refined poles 953 may be associated with a final position on the pole-zero diagram that corresponds to an updated or refined gain or damping gain. The initial poles 954 are indicated as dashed crosses, whereas the final or refined poles 954 are illustrated as solid crosses. The leftward movement/displacement between the initial position of the initial poles 954 and the final position or final or refined poles 954 indicates or suggests in actual or potential increase in stability of the electromechanical system 391 based on corresponding accurate selection of damping gain (ba) by the gain adjuster 372 and/or control of the controller 368.

In one configuration, pole-zero diagram can be similar to a root locus diagram, except the root locus diagram may include one or more operational curves for respective ranges of rotor speeds of the electric machine.

Figure 11:
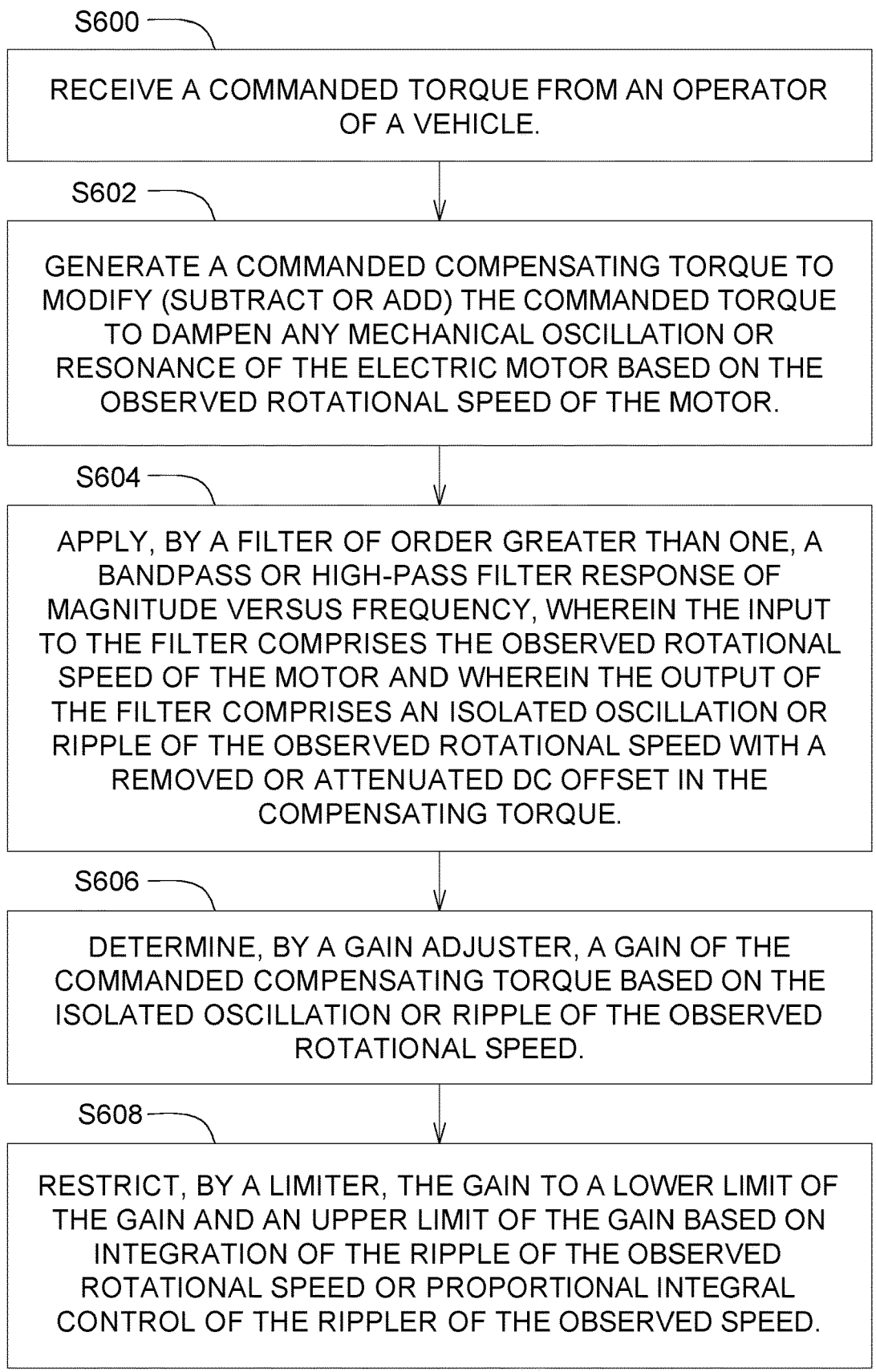
FIG. 11 is a flow chart of one embodiment of a method for controlling an alternating current electric machine that mitigates or dampens mechanical oscillation of the rotor the electric machine (e.g., traction drive electric motor) in a vehicle.

FIG. 11 is a flow chart of one embodiment of controlling an alternating current electric machine that mitigates or dampens mechanical oscillation of the rotor the electric machine (e.g., traction drive electric motor) in a vehicle. The method of FIG. 11 begins in step S600.

In step S600, the torque command generator receives a commanded torque from an operator of a vehicle. For example, the torque command generator is capable of communicating via a vehicle data bus over which an operator inputs a command, such as by depressing an accelerator pedal to increase, decrease or maintain a commanded torque.

In step S602, a torque compensating module generates a commanded compensating torque (e.g., active damping torque $T^*_{ad}$) to modify (e.g., subtract or add) the commanded torque to dampen any mechanical oscillation or resonance of the electric motor based on the observed rotational speed of the motor. For example, the mechanical oscillation or resonance may represent a torque error or torsional torque that places mechanical stress on the rotor of the electric motor and any drive train the couples the electric motor to the wheels or tracks that engage the ground. Further, the mechanical oscillation or resonance may be associated with a certain range of the rotor rotational speed (e.g., rotor mechanical rotational speed or rotor electrical rotational speed) based on a given load or unloaded electric machine. In one embodiment, the torque compensating module modifies the commanded torque by the compensating torque to actively damp the mechanical oscillation or mechanical resonance associated with the loaded electric machine, which minimizes the torque error; hence the mechanical stress on the rotor and any associated drive train of the vehicle.

In step S604, an electronic data processor or a filter of order greater than one (e.g., second order or third order filter) applies a bandpass filter response or high-pass filter response of magnitude versus frequency, wherein the input to the filter comprises the observed rotational speed of the motor and wherein the output of the filter comprises an isolated oscillation or ripple of the observed rotational speed with a removed or attenuated DC offset in the compensating torque.

In step S606, a controller, an electronic data processor, or a gain adjuster determines a gain of the commanded compensating torque based on the isolated oscillation or ripple of the observed rotational speed. Step S606 may be carried out by executing one or more of following techniques separately or cumulatively.

Under a first technique, the controller, the electronic data processor or the gain adjuster is configured to multiply or mix the gain (ba) by the ripple of the observed rotational speed for each sampling interval or set of sampling intervals. For example, the gain can be determined based on a difference between the observed rotational rotor speed and the target rotational speed multiplied by a constant, or based on a difference between the observed rotational rotor speed and the wheel ground speed of the vehicle, where the electric motor is coupled to provide rotational energy to the wheel or tracks, directly or indirectly via a drive train.

Under a second technique, the gain adjuster, data processor or controller is configured to detect whether a rotor of the electric motor is operating in a first speed range or a second speed range that is different than the first speed range; further the gain adjuster, data processor or controller is configured to determine or schedule the gain based on the detected speed range within the first speed range or the second speed range. For instance, the first speed range comprises a low speed range and wherein the second speed range comprises a high speed range.

Under a third technique, the gain adjuster, data processor or controller is configured to detect whether a rotor of the electric motor is operating in a first torque range or a second torque range that is different than the first torque range; further the gain adjuster, data processor or controller is configured to determine or schedule the gain based on detected torque range within the first torque range or the second torque range that is different than the first torque range.

Under a fourth technique, the gain adjuster, data processor or controller is configured to determine or detect whether the electric machine is operating within a first speed range (e.g., which comprises a low speed range) or a second speed range(which comprises a high speed range that is mutually exclusive with respect to the low speed range and bounded by the low speed range); the gain adjuster, data processor or controller is configured to select a first gain based on the detected or determined first speed range, where the first gain is stable because it is associated with one or more poles (on a left side) of respective first root locus diagram of a real root locus component versus an imaginary root locus component corresponds to the first speed range.

Under a fifth technique, the gain adjuster, data processor or controller is configured to determine or detect whether the electric machine is operating within a first speed range (e.g., which comprises a low speed range) or a second speed range(which comprises a high speed range that is mutually exclusive with respect to the low speed range and bounded by the low speed range); the gain adjuster, data processor or controller is configured to select a second gain based on the determined or detected second speed range, where the second gain is stable because it is associated with one or more poles (on a left side) of respective first root locus diagram of a real root locus component versus an imaginary root locus component corresponds to the second speed range. To enhance stability of the combination of the electric motor and load (e.g., via the drive train), the gain may be set or adjusted to make the pole go further to the left side of the vertical axis of the root locus diagram, where the stability can be enhanced be reducing the error between an observed rotor speed and a target rotor speed (e.g., rotor speed aligned with the wheel speed or track speed of wheels or tracks that the electric motor drives directly, or indirectly via a drive train.)

Under a sixth technique, the gain adjuster, data processor or controller, determines a first speed range and a corresponding first gain, or a second speed range and corresponding second gain based on a Bode diagram of magnitude and phase versus rotor speed provides an indication of phase and magnitude discontinuity in a resonant frequency range that can be attenuated (e.g., filtered out) by a digital high pass or digital notch filter). For the resonant frequency range, the gain adjuster, data processor or controller may minimize or reduce the filter gain to extract efficiently the ripple in the commanded torque. Meanwhile, the gain adjuster, data processor or controller may adjust the bandwidth (e.g., half power bandwidth, such as −3 dB from peak magnitude of the resonance) of the filter to be equal to or greater than the bandwidth of the resonant frequency range.

Under a seventh technique, the gain adjuster, data processor or controller, is configured to determine the gain by adjusting the gain without resulting in a material direct-current (DC) offset (e.g., or other material disturbance of the electric motor in combination with the drivetrain) in the commanded torque upon which the electric motor is driven.

Under an eighth technique, the load, which is mechanically coupled to the electric machine, comprises a drivetrain of the vehicle that transmits rotational energy from a rotor of the electric motor to wheels or tracks that engage the ground. Further, there may be a mismatch or observed error between the commanded torque and the observed torque at the wheels or tracks that engage the ground.

Under a ninth technique, the gain adjuster, data processor or controller is configured to increase the acceleration per unit time of the rotor of the electric machine which is subject to a mechanical load, such as driving the tracks or wheels of the vehicle, while maintaining the damping of the mechanical oscillation arising from any mismatch between the rotor speed of the electric motor and the rotational speed of the wheels or tracks with respect to the ground. In one configuration, the gain adjuster, data processor or controller can control the commanded torque more efficiently because additional elevated average torque (in the compensating torque) is not necessary to compensate (e.g., or tending to overcompensate) for losses that would otherwise be associated with active damping of variable or fluctuating DC offsets or DC step changes in the commanded torque.

In step S608, a limiter, electronic data processor or a controller restricts or limits the gain to a lower limit of the gain and an upper limit of the gain based on integration of the ripple of the observed rotational speed or proportional integral control of the ripple component of the observed speed.

In one embodiment, a filter 380 is used to isolate or extract the time-averaged mean or average motor speed ripple component ($\bar{\omega}$). If a first order filter is used for filter 380, the electric machine 117 or electromechanical system 391 is susceptible to a steady state, non-zero, direct-current (DC) offset during acceleration of the rotor of the electric machine 117, or the vehicle that the electric machine 117 drives or propels. Further, the nonzero DC offset is, or tends to be, generally proportional to the active damping gain $b_a$, such that a change or increase the gain, $b_a$, can result in an accompanying change or disturbance in the DC offset of compensating torque $T^*_{ad}$; hence can disturb or interfere with the efficiency or efficacy of torque damping on the electromechanical system 391.

In one configuration, the controller 368 or gain adjuster 372 is configured to multiply the time-averaged mean or average motor speed ripple component ($\bar{\omega}$) by the active damping gain ba to generate the active damping torque $T^*_{ad}$ to attenuate low frequency resonance in the electromechanical system. If a second-order filter or higher-order filter (e.g., higher-order, high pass filter) is used as the filter (380 or 480), the second order or higher order filter (380 or 480) can significantly attenuate, reduce or eliminate the undesired non-zero DC offset in $T^*_{ad}$ from active damping controller. By reducing the budgetary torque allowance that is held in reserve to address a non-zero DC offset in the active damping torque, the control system and method is well suited to efficiently use traction torque $T^*_e$ during motor shaft acceleration/deceleration while damping unwanted resonance of the rotor shaft 385 or the electromechanical system 391. Therefore, by using second order or higher order filter as the filter (380 or 480) a greater amount of average torque tends to be available for acceleration/deceleration of the vehicle driven by the electric machine 117. In other words, there is a reduction in the requisite average traction torque with second order and higher order filter to damp low frequency, mechanical resonance during motor acceleration of the vehicle, which can improve maximum acceleration/deceleration capability.

Further, the controller 368 can establish, select, or determine damping gains to address different operational environments that are detectable with sensors or through sensorless motor control techniques, such as operational environments related to any of the following: low speed, high speed, high torque, low torque, and other parameters.

Although the above filter is configured as described, in one or more alternate embodiments the filter (380, 480), electronic data processor 264 or controller 368 may be adapted or configured in accordance with one or more of the following features: (a) apply an additional filter or replace the filter (380, 480) to filter directly to the active damping torque or compensating torque to attenuate, reduce or eliminate DC offset in active damping torque or compensating torque; (b) determine a proportional or adjusted speed difference between the vehicle ground speed and the rotor speed to extract resonant component to attenuate, reduce or eliminate DC offset in active damping torque or compensating torque; (c) adding feedforward data to the filter (380, 480) or controller 368, (d) programming or providing software instructions to the controller 368 to use a secondary negative feedback, while the primary performance still relies on filter (380, 480) to remove DC offset in active damping torque, and (e) adding an additional integrator controller stage or cascaded stage, or comparable software instructions to the controller 368, to improve system stability of the electric machine 117 in conjunction with the drive train, and to dampen further any potential mechanical oscillation of the electromechanical system 391. Advantageously, the system and method for mitigating mechanical oscillation or resonance may be applied to various vehicles, such as electric vehicles and hybrid electric vehicles with electric machines that are drive by internal combustion engines. The system and method is well suited for cost savings and vehicle weight reduction compared with using physical damper to mitigate mechanical resonance.

Having described one or more embodiments, it will become apparent that various modifications can be made without departing from the scope of the invention as defined in the accompanying claims.

The following is claimed:

1. An inverter system for mitigating oscillation of an electric motor that drives a load, the inverter system further comprising:
   a torque command generation module for receiving a commanded torque from an operator of a vehicle;
   a torque damping module for receiving the commanded torque and generating a commanded compensating torque to dampen any mechanical oscillation or resonance of the electric motor based on the observed rotational speed of the motor; wherein in the torque damping module further comprises:
   a filter of order greater than one, wherein the filter has a bandpass or high-pass filter response of magnitude versus frequency, wherein the input to the filter comprises the observed rotational speed of the motor and wherein the output of the filter comprises an isolated oscillation or ripple of the observed rotational speed with a removed or attenuated DC offset in the compensating torque;
   a gain adjuster coupled to the output of the filter, the gain adjuster configured to determine a gain of the commanded compensating torque based on the isolated oscillation or ripple of the observed rotational speed; and
   a limiter for restricting the gain to a lower limit of the gain and an upper limit of the gain based on integration of the ripple of the observed rotational speed or proportional integral control of the ripple component of the observed speed.

2. The inverter system of claim 1 wherein the filter comprises an filter selected from the group consisting of a digital finite impulse response (FIR) filter, an infinite impulse response (IIR) filter, or cascade integrator comb filter of a second order or third order (wherein the filter may comprise a digital representation of a high pass filter in which a capacitor is in series with an input terminal and output terminal or in which an inductor is in parallel with an input terminal and an output terminal).

3. The inverter system of claim 1 wherein gain adjuster multiples the gain (ba) by the ripple of the observed rotational speed for each sampling interval or set of sampling intervals.

4. The inverter system according to claim 1 wherein a combination of the gain adjuster and the limiter comprises a proportional integral controller or a proportional integral differential controller that is configured to schedule the gain based on detecting whether the electric motor is operating in a first speed range or a second speed range that is different than the first speed range.

5. The inverter system according to claim 4 wherein the first speed range comprises a low speed range and wherein the second speed range comprises a high speed range.

6. The inverter system according to claim 1 wherein a combination of the gain adjuster and the limiter comprises a proportional integral controller or a proportional integral differential controller that is configured to schedule the gain based on detecting whether the electric motor is operating in a first torque range or a second torque range that is different than the first torque range.

7. The inverter system according to claim 6 wherein the first speed range comprises a low speed range and wherein the second speed range comprises a high speed range, where the first speed range is associated with a corresponding first gain or initial gain that is stable relative to one or more poles (on a left-side of first root locus diagram) and wherein a second speed range is associated with a corresponding second gain or revised gain that is stable relative to one or more poles (on the left-side of the second root locus diagram.

8. The inverter system according to claim 1 wherein the gain adjuster is configured to adjust the gain without resulting in a material DC offset in the commanded torque upon which the electric motor is driven.

9. The inverter system according to claim 1 wherein the load comprises a drivetrain of the vehicle that transmits rotational energy from a rotor of the electric motor to wheels or tracks that engage the ground.

10. The inverter system according to claim 1 wherein the drivetrain comprises a transmission and differential gearbox.

11. The inverter system according to claim 1 wherein acceleration of the electric machine is increased while maintaining the damping of the mechanical oscillation arising from any mismatch between the rotor speed of the electric motor and the rotational speed of the wheels or tracks with respect to the ground.

12. A method for mitigating oscillation of an electric motor that drives a load, the inverter system further comprising:
    receiving a commanded torque from an operator of a vehicle;
    generating a commanded compensating torque to modify (subtract or add) the commanded torque to dampen any mechanical oscillation or resonance of the electric motor based on the observed rotational speed of the motor; wherein in the torque damping module further comprises:
    applying, by a filter of order greater than one, a bandpass or high-pass filter response of magnitude versus frequency, wherein the input to the filter comprises the observed rotational speed of the motor and wherein the output of the filter comprises an isolated oscillation or ripple of the observed rotational speed with a removed or attenuated DC offset in the compensating torque;

determining, by a gain adjuster, a gain of the commanded compensating torque based on the isolated oscillation or ripple of the observed rotational speed; and restricting, by a limiter, the gain to a lower limit of the gain and an upper limit of the gain based on integration of the ripple of the observed rotational speed or proportional integral control of the ripple component of the observed speed.

13. The method of claim 12 further comprising:

multiplying the gain (ba) by the ripple of the observed rotational speed for each sampling interval or set of sampling intervals.

14. The method according to claim 12 further comprising:

detecting whether a rotor of the electric motor is operating in a first speed range or a second speed range that is different than the first speed range;

determining or scheduling the gain based on the detected speed range within the first speed range or the second speed range.

15. The method according to claim 14 wherein the first speed range comprises a low speed range and wherein the second speed range comprises a high speed range.

16. The method according to claim 12 further comprising:

detecting whether a rotor of the electric motor is operating in a first torque range or a second torque range that is different than the first torque range; and determining or scheduling the gain based on detected torque range within the first torque range or the second torque range that is different than the first torque range.

17. The method according to claim 16 wherein the first speed range comprises a low speed range and wherein the second speed range comprises a high speed range, where the first speed range is associated with a corresponding first gain or initial gain that is stable relative to one or more poles (on a left-side of first root locus diagram) and wherein a second speed range is associated with a corresponding second gain or revised gain that is stable relative to one or more poles (on the left-side of the second root locus diagram.

18. The method according to claim 12 wherein the determining of the gain further comprises adjusting the gain without resulting in a material DC offset in the commanded torque upon which the electric motor is driven.

19. The method according to claim 12 wherein the load comprises a drivetrain of the vehicle that transmits rotational energy from a rotor of the electric motor to wheels or tracks that engage the ground.

20. The method according to claim 19 comprising:

increasing the acceleration per unit time of the rotor of the electric machine, while maintaining the damping of the mechanical oscillation arising from any mismatch between the rotor speed of the electric motor and the rotational speed of the wheels or tracks with respect to the ground.

* * * * *